United States Patent [19]

Shankar et al.

[11] Patent Number: 5,168,177

[45] Date of Patent: * Dec. 1, 1992

[54] PROGRAMMABLE LOGIC DEVICE WITH OBSERVABILITY AND PRELOADABILITY FOR BURIED STATE REGISTERS

[75] Inventors: Kapil Shankar; Om P. Agrawal, both of San Jose; Fares Mubarak, Fremont; Michele Young, San Francisco, all of Calif.

[73] Assignee: Advanced Micro Devices, Inc., Sunnyvale, Calif.

[*] Notice: The portion of the term of this patent subsequent to Jul. 19, 2005 has been disclaimed.

[21] Appl. No.: 603,817

[22] Filed: Oct. 25, 1990

Related U.S. Application Data

[60] Continuation-in-part of Ser. No. 489,775, Mar. 5, 1990, abandoned, which is a continuation of Ser. No. 307,183, Feb. 2, 1989, abandoned, which is a continuation of Ser. No. 806,158, Dec. 6, 1985, abandoned, and a continuation-in-part of Ser. No. 462,097, Jan. 8, 1990, abandoned, which is a continuation of Ser. No. 217,942, Jul. 12, 1988, Pat. No. 4,939,391, which is a division of Ser. No. 868,970, May 30, 1986, Pat. No. 4,758,747.

[51] Int. Cl.⁵ .................................... H03K 19/177
[52] U.S. Cl. ...................... 307/465; 364/716; 340/825.23
[58] Field of Search ............... 307/465-468; 364/716; 340/825.83

[56] References Cited

U.S. PATENT DOCUMENTS

| | | | |
|---|---|---|---|
| 4,758,747 | 7/1988 | Young et al. | 307/465 |
| 4,771,285 | 9/1988 | Agrawal et al. | 307/465 |
| 4,876,640 | 10/1989 | Shankar et al. | 307/465 |
| 4,879,481 | 11/1989 | Pathak et al. | 307/465 |
| 4,940,909 | 7/1990 | Mulder et al. | 307/465 |

FOREIGN PATENT DOCUMENTS 0245884 11/1987 European Pat. Off. ............ 307/465

Primary Examiner—Timothy P. Callahan
Attorney, Agent, or Firm—Fliesler, Dubb, Meyer & Lovejoy

[57] ABSTRACT

A device having a number of general registers each allocated an input/output port and a number of internal "buried" state registers. A user-controlled signal permits observation of the contents of the buried state registers at an input/output port although these registers are not allocated an input/output port. Each register is connected to a logic circuit internal to the device by a dedicated feedback path so that all registers can be used to specify states in a state machine sequencer. A fuse-programmable XOR gate permits a user to control generation of signals at the ports by permitting enabling and disabling of an inverting output buffer. Asynchronous reset and synchronous preset of the registers is provided. In addition to the dedicated feedback paths, programmable feedback paths are provided. An output inverter can selectably be enabled from internal signals or from an externasl pin. The input/output circuit can be deployed in banks, each bank selectably receiving the same or a different clock. The registers can be preloaded via an internally-generated signal or from the external pins. In an alternative embodiment, a programmable AND array and a pair of programmable OR arrays, each serving one of the banks, provides a flexible programmable logic array device with observable buried states.

72 Claims, 8 Drawing Sheets

OBSERVABILITY CIRCUITRY TRUTH TABLE

| | INPUTS | | | | | | | SIGNALS | | | | | | | | | | | | |
|---|---|---|---|---|---|---|---|---|---|---|---|---|---|---|---|---|---|---|---|---|
| LOGIC MODE | I...I/O ARRAY INPUT SIGNALS | H OBS PT | P2 PIN 2 | P1 PIN 1 | P11 PIN 11 | P15 PIN 15 | A PRE-LOAD | B PRE EN | C OBSD | D OBS PRE | E PV CC | F I5 | G OBS VER | H OBS PT | I OBS | J OBS | K OBS | L | M | N CPB | O CPO | P CPO OUT-PUT |
|---|---|---|---|---|---|---|---|---|---|---|---|---|---|---|---|---|---|---|---|---|---|---|
| OBSERVE OUTPUT RESERVE DATA | I/O | 0 | I/O | 1 | I/O | 0 | 0 | 1 | 1 | 1 | 0 | 1 | 1 | 0 | 1 | 0 | 0 | 0 | 0 | 0 | 0 | Q |
| | I/O | 0 | I/O | 0 | I/O | 0 | 0 | 1 | 1 | 1 | 0 | 1 | 1 | 0 | 1 | 0 | 0 | 0 | 1 | 1 | 1 | Q |
| OBSERVE BURIED STATE REG. DATA | I/O | 1 | I/O | 1 | I/O | 0 | 0 | 1 | 1 | 1 | 0 | 1 | 1 | 1 | 0 | 1 | 0 | 0 | 0 | 0 | 0 | QB |
| | I/O | 1 | I/O | 0 | I/O | 0 | 0 | 1 | 1 | 1 | 0 | 1 | 1 | 1 | 0 | 1 | 0 | 0 | 0 | 1 | 1 | QB |
| PRELOAD MODE | | | | | | | | | | | | | | | | | | | | | | |
| PRELOAD ALL OUTPUT REGISTERS | I/O | X | Z | 0 | I/O | 0 | 1 | 0 | 0 | 0 | 0 | 1 | 1 | X | 0 | 0 | 0 | 1 | 1 | 1 | 0 | X |
| | I/O | X | Z | 1 | I/O | 0 | 1 | 0 | 0 | 0 | 0 | 1 | 1 | X | 0 | 0 | 0 | 1 | 1 | 1 | 0 | PD |
| | I/O | X | Z | 0 | I/O | 1 | 1 | 0 | 0 | 0 | 0 | 1 | 1 | X | 0 | 0 | 0 | 1 | 1 | 0 | 1 | X |
| | I/O | X | Z | 1 | I/O | 1 | 1 | 0 | 0 | 0 | 0 | 1 | 1 | X | 0 | 0 | 0 | 1 | 1 | 0 | 1 | PD |
| PRELOAD BURIED STATE REGISTERS | I/O | X | Z | 0 | I/O | Z | 1 | 0 | 0 | 0 | 0 | 1 | 1 | X | 0 | 0 | 0 | 0 | 1 | 0 | 1 | X |
| | I/O | X | Z | 1 | I/O | Z | 1 | 0 | 0 | 0 | 0 | 1 | 1 | X | 0 | 0 | 0 | 0 | 1 | 0 | 1 | PD |
| VERIFY MODE | | | | | | | | | | | | | | | | | | | | | | |
| VERIFY BURIED STATE REG. PRODUCT TERMS | I/O | X | I/O | 0 | I/O | 0 | 0 | 1 | 0 | 1 | 1 | 0 | 1 | X | 0 | 0 | 1 | 0 | 0 | 1 | 1 | QB |
| | I/O | X | I/O | 1 | I/O | 0 | 0 | 1 | 0 | 1 | 1 | 0 | 1 | X | 0 | 0 | 1 | 0 | 0 | 0 | 0 | QB |
| VERIFY OUTPUT REG. PRODUCT TERMS | I/O | X | I/O | 0 | I/O | 1 | 0 | 1 | 0 | 1 | 1 | 0 | 1 | X | 0 | 1 | 0 | 0 | 0 | 1 | 1 | Q |
| | I/O | X | I/O | 1 | I/O | 1 | 0 | 1 | 0 | 1 | 1 | 0 | 1 | X | 0 | 1 | 0 | 0 | 0 | 0 | 0 | Q |

*FIGURE 5A*

| I/O | = | HI OR LO VALUE |
| --- | --- | --- |
| I | = | HI VALUE |
| O | = | LO VALUE |
| Z | = | ZHI VALUE |
| X | = | DON'T CARE |
| Q | = | VALUE IN OUTPUT REGISTER |
| QB | = | VALUE IN BURIED REGISTER |
| PD | = | PRELOAD DATA |

PRELOAD WAVEFORMS

PROGRAMMING AND VERIFICATION WAVEFORMS

PROGRAMMABLE LOGIC DEVICE WITH OBSERVABILITY AND PRELOADABILITY FOR BURIED STATE REGISTERS

This application is a continuation-in-part of U.S. application Ser. No. 489,775, filed Mar. 5, 1990, now abandoned which is a continuation of U.S. application Ser. No. 307,183, filed Feb. 2, 1989, now abandoned, which is a continuation of U.S. application Ser. No. 806,158, filed Dec. 6, 1985, now abandoned; and is also a continuation-in-part of U.S. application Ser. No. 462,097, filed Jan. 8, 1990, now abandoned which is a continuation of U.S. application Ser. No. 217,942, filed Jul. 12, 1988, now U.S. Pat. No. 4,939,391 which is a division of U.S. application Ser. No. 868,970, filed May 30, 1986, now U.S. Pat. No. 4,758,747. Additionally, a related, copending application of particular interest to the instant application is U.S. Ser. No. 795,159, filed Nov. 5, 1985 on behalf of Om P. Agrawal, Kapil Shankar and Fares Mubarak, now U.S. Pat. No. 4,771,285, entitled "Programmable Input/Output Cell with Flexible Clocking and Flexible Feedback." The above applications and patents are assigned to the assignee of the instant application and are incorporated herein by reference.

BACKGROUND OF THE INVENTION

1. Field of the Invention

This invention relates generally to programmable logic devices, and more particularly to programmable logic devices having buried state registers.

2. Description of the Related Art

As the technology for manufacturing integrated circuits progresses, it is becoming possible to put more and more discrete logic components on a single integrated circuit chip. For instance, there can be thousands of discrete logic components, such as, AND-gates, OR-gates, inverters and registers, on a single integrated circuit chip. However, due to limitations in packaging technology, the number of input and output ports to a given integrated circuit chip is limited. Thus, thousands of discrete logic components must be served typically by on the order of a few dozen input/output (I/O) ports. The small number of input/output ports available for a given integrated circuit thus severely restricts the flexibility in design of logic circuits implemented on integrated circuit chips.

Programmable logic devices such as the programmable array logic (PAL) device offer digital designers a flexible and cost effective implementation for complex logic circuits. PAL, an acronym for a Programmable Array Logic device, is a registered trademark of Advanced Micro Devices, Inc. A typical PAL device includes a fuse programmable array of AND gates, and a fixed array of OR gates. In some PAL devices, the outputs of the OR gates are coupled directly to an I/O pin, and in other PAL devices the outputs of the OR gates are input into clockable, D-type or S/R-type registers.

Flexibility in design is particularly important for devices such as programmable array logic devices. In a programmable array logic device, a user of the device configures the logic array according to a specific need using field programming techniques. Since the user is constrained in his design choices by the configuration of the input/output pins, the utility of the programmable logic array is limited.

A prior U.S. patent application owned by the assignee in common with the present application, entitled PROGRAMMABLE INPUT/OUTPUT CELL WITH FLEXIBLE CLOCKING AND FLEXIBLE FEEDBACK, Ser. No. 795,159, filing date of Nov. 5, 1985, addresses one way in which the configuration of input/output ports may be made more flexible. There, the user is able to select from a variety of input modes or a variety of output modes for a given input/output pin by setting a selector means using field programming techniques, such as blowing a fuse or not blowing the fuse, when the designer sets up the logic circuit on the chip in conjunction with user-determined "product terms" generated within the logic array. In the input mode the port may be configured as a dedicated, registered, or latched input; in the output mode as registered, combinatorial or latched output. A register/latch, in conjunction with a fuse-programmable input select multiplexer, can function as an input, output or buried register or as a transparent latch. A programmable clock select multiplexer selects between a clock/latch enable signal applied at an external pin or a product term generated internally. Clock polarity control is also provided. Asynchronous reset and preset of the register/latch is provided along with polarity control therefor. Dedicated and programmable feedback paths are provided. An output inverter can selectably be enabled from internal signals or from an external pin. The input/output circuit can be deployed in banks, each bank selectably receiving the same or a different clock. The register/latch can be preloaded via an internally-generated signal or from the external pins. Thus, for example, the designer is able to locate registered outputs and combinatorial outputs on the I/O pins as he desires for a selected logic array package.

Another way in which to increase the flexibility of the design for programmable array logic devices of the prior art provides selectable feedback in the output logic so that the designer may choose using field programming techniques to provide a feedback path directly from the I/O pin to the logic array, in effect, treating the I/O pin as an input pin, or to select a registered output from the logic array as feedback. This sort of feedback system is described in product literature for the Advanced Micro Devices 24-pin IMOX TM Programmable Array Logic Device designated the AmPAL22V10 (PAL is a registered trademark of Monolithic Memories, Inc.). An advanced information sheet concerning the AmPAL22V10 was released by Advanced Micro Devices, Inc., Sunnyvale, Calif. dated June, 1983. This advanced information can be referred to for further background to the present invention.

Both the input selector and the feedback selector of the prior art mentioned above involve a designed-in or field programmed selection of the type of feedback or the type of output for a particular I/O pin. Accordingly, the user was limited to one configuration of each I/O pin for the device. Since it is desirable to provide a flexible output logic circuit, there is a need for an output logic circuit which provides for increased flexibility and overcomes the limitations of the prior art.

PAL devices having clockable registers are ideal for use as state machines or, as they are sometimes called, sequencers. A state machine includes a number of registers which store the current state of the machine, input combinatorial logic, and output combinatorial logic. Typically, the outputs of the input combinatorial logic determine the next state to be stored within the state registers, and the current state stored in the state registers form a part of the input to the output combinatorial logic. Quite frequently, outputs of the output combinatorial logic are fed back as inputs to the input combinatorial logic.

Frequently, the contents of registers within the programmable array logic devices used solely as state machine counters need not be conducted to I/O pins, since their contents are used internally for counting purposes. However, the prior art has nevertheless allocated an I/O pin to each of such registers for such PAL sequencers.

Complex state machine designs push the limits of prior art PAL devices. For a variety of practical technical and economic reasons, it is desirable to keep the PAL device package as small as possible and to limit the number of pins associated with the package. PAL device designers found that one way to shrink package size is to provide several "buried" state registers which can be used to store the current state number, and separate output registers which can output data to an I/O pin. By not assigning a I/O pin to the buried state registers the number of pins required to implement the device is reduced.

Thus, it is often desirable to deploy a register within the logic circuit as a dedicated buried state register. Accordingly, there is need for an input/output circuit which can be flexibly configured in which a so-called "buried," or internal, state register can be flexibly utilized. This feature allows the system designer to build improved state machines or sequencers.

However, mere provision of such accessible registers is not sufficient because a circuit must be tested by the designer. This requires dynamically observing the contents of these internal state registers during debugging and circuit verification.

Thus, a problem with the above-mentioned prior-art PAL design having separate buried state registers and output registers is that it is difficult to observe the contents of the buried state registers. With such designs, the output of a buried state register must be clocked through the output combinatorial logic and an output register before appearing at an I/O pin. This process can take several cycles, and is thus both inconvenient and time consuming.

Another problem with the above mentioned prior art PAL design is that it is difficult to preload the buried and output registers for debugging purposes. Without a preloading capability, a sequence of inputs to the device would have to be devised to attain a desired state within the PAL, which again is an inconvenient and time consuming process.

Further, while the prior art provides dedicated feedback, for the determination of states, from the registers allocated an I/O pin, a designer would like to permit the state to be a function of the contents of all registers, including the internal state registers. Accordingly, it would be desirable to have dedicated feedback from all registers, so that the designer can flexibly construct a state machine with a variable number of internal states and a variable number of registers allocated an I/O pin.

A further desirable feature is the ability to preload registers from the logic array, rather than applying a Zener level preload voltage, which may not be available during testing stages.

Provision of an independent combinatorial signal from a programmable OR portion of the logic array, separate from the signal received therefrom and stored in a register, is desirable in that the register may be used as a buried register when the signal received independently from the array is conducted to the I/O pin serving this register. This capability also allows the designer a different combinatorial and a different sequential output to be fed back from the same device, by selecting the output appropriately.

Furthermore, it is often desirable to allow clocking of the register of individual logic circuits from the logic array as well as from the usual clock, with selection by the user. It may even be desirable to permit user-selection from a pair of clocks, particularly when the integrated circuit chips employing the output logic circuits are deployed in two banks, each with its own clock.

SUMMARY OF THE INVENTION

An object of this invention is to provide a PAL circuit which permits the contents of buried state registers to be quickly and easily observed.

Another object of this invention is to provide a PAL circuit for efficiently loading individual buried registers and/or output registers.

The present invention provides, in one embodiment, a programmable array logic integrated circuit device having a set of input/output (I/O) pins each served by a dedicated output register, a set of I/O pins each served by an I/O cell which permits flexible user configuration of the I/O pin, and a set of dedicated buried state registers not allocated I/O pins, but whose contents are nevertheless observable, under control of the user, at the I/O pins shared with the dedicated registers and the I/O cells.

A typical programmable array logic device according to the present invention, may for instance include twenty external pins, of which eight are I/O pins, four of which may be served by dedicated output registers and four served by I/O cells. The four dedicated output registers provide registered output from a variable distribution of eight, eight, twelve and twelve logic signal lines conducted from the programmable AND array portion of the PAL device of the instant invention, to four eight-, eight-, twelve- and twelve-input OR gates connected to the data (D) input terminals of the dedicated output registers. A dedicated feedback path connects each of four I/O pins served by the output registers to the AND array.

Fuse-programmable polarity-selection means included with the dedicated output registers allow the user to determine the polarity of the signal that will be generated at the I/O pin corresponding to the signal generated by the register. An inverting buffer driving each such I/O pin can be enabled by a signal whose polarity is also user-determinable.

The present invention also includes four input/output (I/O) cells for controlling the configuration of four input/output pins served by the cells which allows for dynamic control of the configuration and increases the flexibility of design for the user of the invention. The configuration of the input/output cell is dynamically controlled by the user by coordinating various signals generated by a programmable array logic device, in conjunction with various field-programmable fuses within the I/O cell.

The four input/output cells provide a means for controlling configuration of an input/output pin served by each cell and receive at an OR gate a variable distribution of eight, eight, ten and ten, respectively, logic signals from the AND array of the integrated circuit. A fuse-programmable output select multiplexer receives both the logic signal and the signal generated by a register included in the I/O cell and selects, responsive also to an output select signal, either the logic signal or the registered signal as output from the output cell.

A fuse-programmable feedback select multiplexer, selects either the signal on the I/O pin served by the cell or the registered signal to be fed back to the AND array. Further, fuse-programmable polarity-selection means as described for the dedicated output registers are included in the I/O cell. Accordingly, the output inverting buffer, the output select multiplexer, the feedback multiplexer, and the polarity-selection means are controllable by a combination of their respective programmable fuses and dynamic control signals. For instance, combinatorial output signals from the AND array can be generated at one I/O pin and registered output signals can be fed back simultaneously to the AND array by appropriate selection of fuses and control signals.

A set of six dedicated buried state registers receive a variable distribution of six, six, eight, eight, ten and ten, respectively, combinatorial logic signals from the AND array at their respective OR gates connected to the data (D) input of the buried registers. A dedicated feedback path connects the output terminal of each register to the AND array. Accordingly, a designer can choose any of the contents of the dedicated output registers, the input-/output cells, and/or the dedicated buried state registers, as "state" registers in the design of a state machine sequencer.

A fuse-programmable exclusive OR (XOR) gate is provided which allows flexible control of the signals conducted via the output inverting buffers. Unlike the prior art, which typically used a multiplexer providing means to disable the outputs generated by such buffers, the XOR gate permits the user to truly enable or disable the output buffers based on a combination of multiple signals or their complements.

A user-controlled observability enable signal "product term" is received by a set of six inverting buffers serving the buried registers as well as the inverting buffers serving the dedicated output registers and two of the four inverting buffers serving the I/O cells. This signal causes the latter six buffers to disable signal flow from the six respective output registers and I/O cells to the respective I/O pins and to enable signal flow from the six buried registers to the respective I/O pins. Hence, the contents of the buried registers can be monitored for debugging of the device.

Each of the dedicated output and buried registers, and the registers within the I/O cell receives a common asynchronous reset and synchronous preset product term from the AND array. While an exemplary embodiment of the invention is given in terms of field-programmable fuses, CMOS, EPROM and E²PROM memory cells as equivalents to the fuses are developed in the related copending application, incorporated herein by reference.

In one embodiment, multiplexer means are provided to allow clocking of the register of individual output logic circuits from the logic array as well as from the usual clock, with selection by the user. In an exemplary embodiment, this feature is used to permit user selection from a pair of clocks, when the input/output logic circuits of the present invention are deployed in two banks, each with its own clock. Means are also provided to permit user selection of clock polarity.

In an aspect of the present invention, a logic device includes a programmable logic array, at least one register pair including a buried register and an output register, a multiplexer coupling the outputs of the buried register and the output register to a common I/O pin, an observability buffer for controlling the multiplexer, and a dual clock buffer for selectively preloading the buried register or the output register.

The contents of the buried register and the output register can be observed in three operational modes of the device, namely the logic mode, the preload mode, and the verification mode. When in the logic mode, either the output of the buried register or the output register can be multiplexed to the I/O pin under the control of an observability product term generated by the logic array. More specifically, under normal operating conditions in the logic mode the output register is multiplexed to the I/O pin, and under debug operating conditions in the logic mode the buried register is multiplexed to the I/O pin. When in the preload mode, the observability product term is disabled, and data is synchronously input into either the buried register or the output register from the I/O pin under the control of the dual clock buffer. In the verification mode, the observability product term is once again disabled, the logic array is enabled for product term output, and product terms are clocked into the buried register and the output register for multiplexing to the I/O pin.

An advantage of the present invention is that a buried register and an output register share a common I/O pin, which minimizes pin count and package size while permitting the contents of buried registers to be quickly and easily observed.

Another advantage of this invention is that the buried register and the output register can be preloaded from their shared I/O pin under user control.

Another advantage of this invention is that product terms from the logic array can be observed via the register pair when the device is in its verification mode.

Other objects, features and advantages of the present invention will become apparent upon consideration of the following detailed description and the accompanying drawings, in which like reference designations represent like features throughout the figures.

BRIEF DESCRIPTION OF THE DRAWINGS

FIG. 5a is a truth table illustrating the logic signals at various points in the black diagram of FIG. 4;

FIG. 5b is a legend for the truth table of FIG. 5a;

FIG. 8 is a schematic of the observability buffer shown in FIG. 4.

DETAILED DESCRIPTION OF THE INVENTION

Reference is made now in detail to a specific embodiment of the present invention, which illustrates the best mode presently contemplated by the inventor for practicing the invention. Alternative embodiments are also briefly described as applicable.

Figure 1:
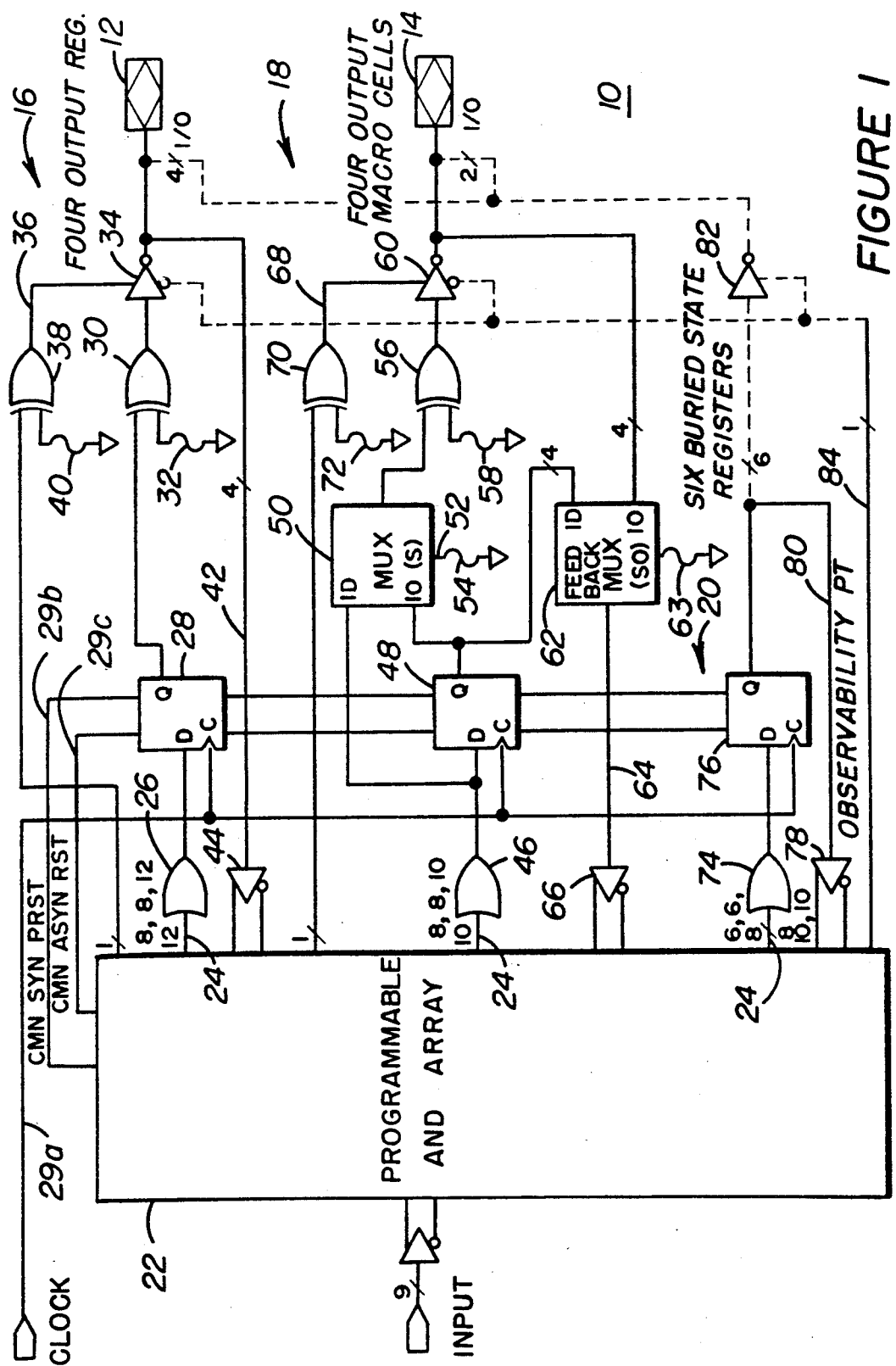
FIG. 1 is a logic diagram of a first preferred embodiment of the present invention.

FIG. 1 is a logic diagram of the programmable array logic (PAL) device 10 of the present invention. The PAL 10 as shown in FIG. 1 permits configuration of the input/output ports of an integrated circuit chip, such as input/output (I/O) pins 12 and 14. For purposes of illustration, only one, 12, of the several, such as four, I/O pins is shown, which serve the several, such as four, dedicated output register portions only one, 16, of which is shown. Similarly, only one, 14, of the several, such as four, I/O pins is shown, which serve the several, such as four, output macro cells 18. Also, only one, 20, of the several, such as six, buried state register portions is shown in FIG. 1.

The PAL device 10 is connected to a programmable AND array 22, which generates combinatorial logic signals on a set of lines 24. The construction of the programmable AND array 22 is discussed in more detail below. As appreciated in the art, other means for dynamically providing the control signals in this invention can be used, such as a combination of logic signals from a plurality of programmable AND arrays. The lines 24 conduct the logic signals generated by AND array 22 to OR gates serving the dedicated output register portions 16, the output macro cells 18 and the buried state register portions 20. A variable number of lines 24 is connected to each of the various OR gates so as to provide a variable distribution of signals to more efficiently utilize the AND array 22. The numbers adjacent the lines 24 at their terminus on the OR gates shown in FIG. 1 indicate the number of lines terminating on a particular one of the OR gates serving the four output register portions 16, the four output macro cells 18, and the six buried state register portions 20. Various other signal lines shown in FIG. 1 also have numbers adjacent to them which similarly indicate the number of signals conducted in parallel between the elements interconnected by the signal line.

These signals, also called "product terms," are conducted on lines 24 to an OR gate 26 serving the particular dedicated output register portion 16 shown in FIG. 1. Further description of these so-called "product terms" is also contained hereinafter. OR gate 26 is connected to a data (D) input of a register 28. Responsive to a clock (CLK) signal on line 29 received at a clock (C) input of register 28 generates a signal at a Q output terminal thereof. Alternatively, the state of register 28 may be set by application of a common synchronous preset (CMN SYN PRST) signal received from the AND array 22 via a signal line 29a or a common asynchronous reset (CMN ASYN RST) signal received from the AND array 22 via a signal line 29c. A fuse-programmable exclusive OR (XOR) output polarity control gate 30 receives at a first input the signal generated by register 28. A second input of XOR gate 30 is connected to a field-programmable fuse 32, the status of which determines the polarity of the signal generated by dedicated output register portion 16.

Each field-programmable fuse circuit includes a resistor (not shown) connected to a high-potential Vcc. In parallel with the resistor is a fuse connected to ground. The fuse is a field-programmable fuse which may be blown or not blown as the user desires when he sets up the device to choose various features such as input selection and clock polarity. Means for dynamically providing control signals can be implemented, instead of by the static field-programmable input, by the product terms generated by programmable AND arrays, a combination of programmable AND arrays, or the like. Further, it will be appreciated by those skilled in the art that the control signals determined by the state elements shown in the figures, and described herein, as field-programmable fuses, may be alternatively provided by CMOS, EPROM or E$^2$PROM memory elements or by signals applied to external pins of the integrated circuit.

The dedicated output register portion 16 also includes an output inverting buffer 34 which receives the output signal generated by output polarity control gate 30. The output inverting buffer 34 is enabled by an output enable signal received on line 36. A product term is conducted from the programmable AND array 22 to a first input of a fuse-programmable output enable polarity control XOR gate 38. A second input of XOR gate 38 is connected to a field-programmable fuse 40, the status of which determines the polarity of the output enable signal received by buffer 34. The signal generated by buffer 34 is conducted to I/O pin 12 and via a feedback circuit path 42 from the I/O pin 12 directly to a true and complement buffer 44. The signals generated at the output terminals of input buffer 44 are conducted to the AND array 22.

Other product terms are conducted on lines 24 from AND array 22 to an OR gate 46 serving the particular output macro cell 18 shown in FIG. 1. OR gate 46 is connected to the data input (D) of a register 48. Responsive to the clock (CLK) signal on line 29a, the register 48 generates a signal at a Q output terminal. Alternatively, the state of register 48 may be set by application of the CMN SYN PRST or CMN ASYN RST signals received from the programmable AND array via lines 29b and 29c. The asynchronous reset signal will cause the register 28 to generate a logic ZERO output signal at its Q output terminal when the common asynchronous reset signal CMN ASYN RST goes HIGH. This switching occurs independent of the CLK signal applied to register 28. When the common synchronous preset signal CMN SYN PRST is set, the signal generated at the Q output of the register 28 is set to a HIGH signal when clocked by the CLK signal received by register 28. Means providing the synchronous preset signal CMN SYN PRST or asynchronous reset sinal CMN ASYN RST are not shown in FIG. 1, but can be implemented dynamically using various product terms generated by the programmable AND array 22 of the like.

The output macrocell portion 18 shown in FIG. 1 further includes an output select 2-to-1 multiplexer 50, which receives the signal generated by register 48 at a 1O input terminal and the signal generated by OR gate 46 at a 1D input terminal.

The output select multiplexer (MUX) 50 generates at an output terminal either the signal applied at its 1D or the signal applied at its 1O input terminal depending on the state of the signal applied to an output control select input S as provided over line 52. A field-programmable fuse 54 is connected to line 52 which determines the state of the output select signal applied to input S. The fuse 54 connected to input S determines the "output selection." A fuse-programmable XOR gate 56 receives at a first input the signal generated by MUX 50 and a fuse 58 connected to a second input of gate 56 determines the "output polarity" of the signal generated by output macrocell 18 and conducted to an inverting output buffer 60.

Included in the output macrocell 18 of FIG. 1 is a fuse-programmable two input/one output feedback multiplexer (MUX) 62. The feedback MUX 62 receives at a 1D input terminal the logic signal generated by the inverting buffer 60 or received from the I/O pin 14. MUX 62 receives at a 1O input terminal the signal generated at the Q output terminal of register 48.

The feedback MUX 62 generates at its output terminal one of the signals applied to its 1D or 1O terminals as controlled by the field-programmable fuse 63 connected to a control select input (So) of MUX 62. Thus, in response to a feedback select control signal applied to the SO terminal, the feedback MUX 62 selects from the signals applied to its 1D or 1O input terminals to generate a feedback signal on line 64. The feedback signal on line 64 is conducted to an input buffer such as the true and complement buffer 66 for feedback to the logic circuits internal to the AND array 22 of the integrated circuit.

The output inverting buffer 60 is enabled by an output enable signal received on line 68. A product term is conducted from the programmable AND array 22 to a first input of a fuse-programmable output enable polarity control XOR gate 70. A second input of XOR gate 70 is connected to a field-programmable fuse 72, the status of which determines the polarity of the output enable signal received by buffer 60. The signal generated by buffer 60 is conducted to I/O pin 14.

Other product terms are conducted on lines 24 from AND array 22 to an OR gate 74 serving the particular buried state register portion 20 shown in FIG. 1. OR gate 74 is connected to the data input (D) of a so-called "buried" register 76. Responsive to the clock (CLK) on line 29a, the buried register 76 generates a signal at its Q output terminal. Alternatively, the state of register 76 may be set by application of the CMN SYN PRST or CMN ASYN RST signals received on lines 29b and 29c.

The signal generated by buried register 76 is conducted to a true and complement buffer 78 on a feedback signal path 80 and therefrom to the programmable AND array 22. The signal generated by register 76 is also conducted to an inverting output buffer 82 which receives a user-determinable OBSERVABILITY product term signal from the AND array 22 via a signal line 84. Output buffers 34 and 60 also receive the OBSERVABILITY signal at a complement input.

Buffers 34 and 60 can be enabled by the output enable signals received on lines 36 and 68, respectively, to conduct signals generated from the dedicated output register portion 16 and from the output macrocell 18, respectively, to the I/O pins 12 and 14, respectively. Alternatively, the buffers 34 and 60 can be disabled by the OBSERVABILITY signal on line 84 and the buffer 82 can be enabled by the OBSERVABILITY signal so as to conduct signals generated from the buried state register portion 20 of the PAL device 10 to the I/O pin 12 or the I/O pin 14. The OBSERVABILITY product term signal accordingly suppresses the selection of the normal output signals and allows observation of the contents of the buried state registers at the I/O pins 12 and 14.

As mentioned earlier, the control of any of the circuit elements shown in FIG. 1 by means of the programmable fuses 32, 40, 54, 58, 63 and 72 can be alternately provided by product terms generated by the circuits internal to the integrated circuit chip containing circuit 10. Another alternative is to control any of these elements by signal applied to the external terminals (pins) of the integrated circuit chip, as will be appreciated by those skilled in the art.

The programmable AND array 22 shown in FIG. 1 is constructed using the sum-of-products scheme familiar to those skilled in the art, although other combinations of logic cells can be used. Reference can be had to "Programmable Array Logic Handbook," copyright 1984, Advanced Micro Devices, Inc. and to the related, copending application entitled "Programmable Input-/Output Cell with Flexible Clocking and Flexible Feedback" for further details of the internal construction of PALs.

As shown in FIG. 1, the logic signal on lines 24 is provided as a sum-of-product term combinatorial signal to the OR gates 26, 46 and 74. In FIG. 1, these three OR gates are shown receiving signals from a variable number of separate programmable AND gates within array 22 to provide the combinatorial signal received by the registers 28, 48, and 76, respectively. However, as is appreciated in the art, any number of programmable AND gates can be designed as an input to the OR gates to provide this combinatorial signal.

In the preferred embodiment of FIG. 1, a clock is connected to an input providing a clock signal on line 29a.

Each of the dynamic control signals discussed with reference to FIG. 1, are provided as the output of the single programmable AND array 22. Accordingly, the common asynchronous reset signal (CMN ASYN RST) and the common synchronous preset signal (CMN SYN PRST) are provided as the output of the programmable AND array on lines 29c and 29b, respectively. The observability signal is provided as the output of a programmable AND array on line 84. The various output enable signals are provided as the output of the programmable AND array on signal lines connected to XOR gates 38 and 70. Any of the control signals mentioned above can be implemented by more complicated logic circuitry, such as sum-of-products terms, if desired.

The means providing the various dynamic control signals can be configured in a variety of manners, either as a simple product term from the output of a single programmable AND array 22 or as a sum-of-products term from the output of an OR gate summing a plurality of programmable AND arrays. Further, each I/O pin can be configured uniquely.

In FIG. 1, the common synchronous preset signal CMN SYN PRST and CMN ASYN RST signal are provided in common to all the registers (See FIG. 1) in the output register portions 16, the output macrocells 18, and the six buried register portions 20 of the programmable array logic device 10. The synchronous preset signal is dynamically provided as a product term from the output of programmable AND array on line 29b. As with the other dynamic control signals, the common synchronous preset (CMN SYN PRST) or common asynchronous reset (CMN ASYN RST) can be implemented with other logic circuitry such as a sum-of-products term according to the present invention.

The function of the programmable array logic device 10 is enhanced by the dynamically provided control signals in conjunction with the six programmable fuses 32, 40, 54, 58, 63 and 72. The fusible link 32 of the device 10 of the instant invention can be set to determine whether the signal generated by XOR gate 30 is active HIGH or active LOW and thus fuse 32 is referred to as the dedicated output register portion 16 polarity fuse. Fusible link 58 performs output polarity selection for the output macrocell 18.

The fusible links 40 and 72 can be set to determine whether the output enable control signals received by XOR gates 38 and 70, respectively, are to disable or enable the output buffers 34 and 60, respectively.

The fusible link 54 connected to MUX 50 can be set to determine whether the combinatorial signal at its 1D input or the registered signal at its 1O input will be conducted to the output polarity XOR gate 56. And the state of fusible link 63 connected to MUX 62 similarly determines whether the registered signal at its 1D input or the signal on the I/O pin 14 conducted to its 1O input is to be fed back to the AND array 22.

As the foregoing discussion illustrates, the function of the programmable array logic device 10 is greatly enhanced by the output logic circuits 16, 18 and 20 of the present invention. Further, the output logic circuits can be utilized in a variety of integrated circuit devices to enhance the flexibility and dynamic control of the particular circuit implemented on the integrated circuit chip. In this manner the limitation occasioned by the relatively small number of input/output ports on a given integrated circuit chip with respect to the number of logic devices implemented on the chip can be minimized.

Figure 2:
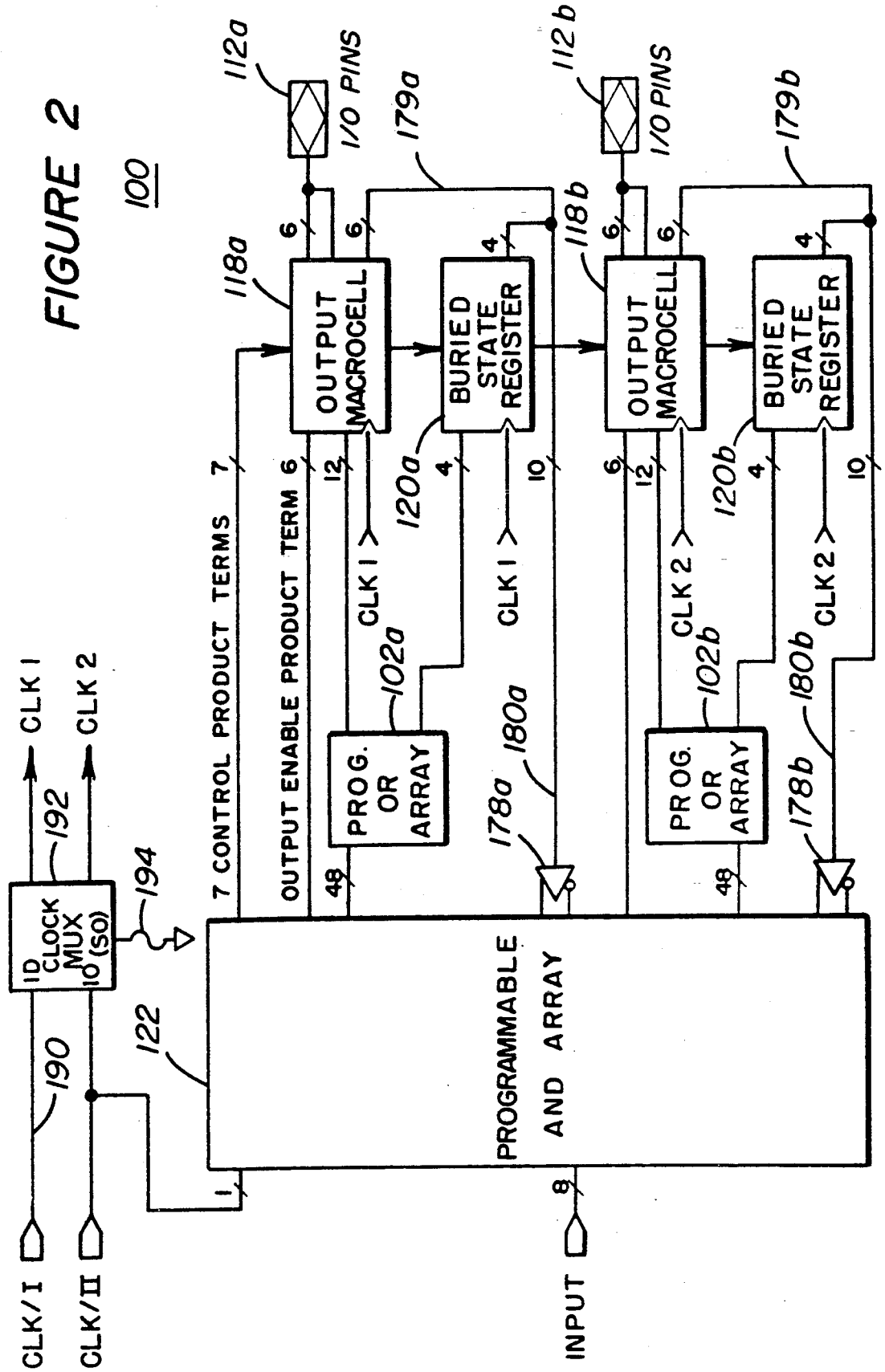
FIG. 2 is a logic diagram of a programmable logic device implementing the present invention employing dual clocks.
Figure 3:
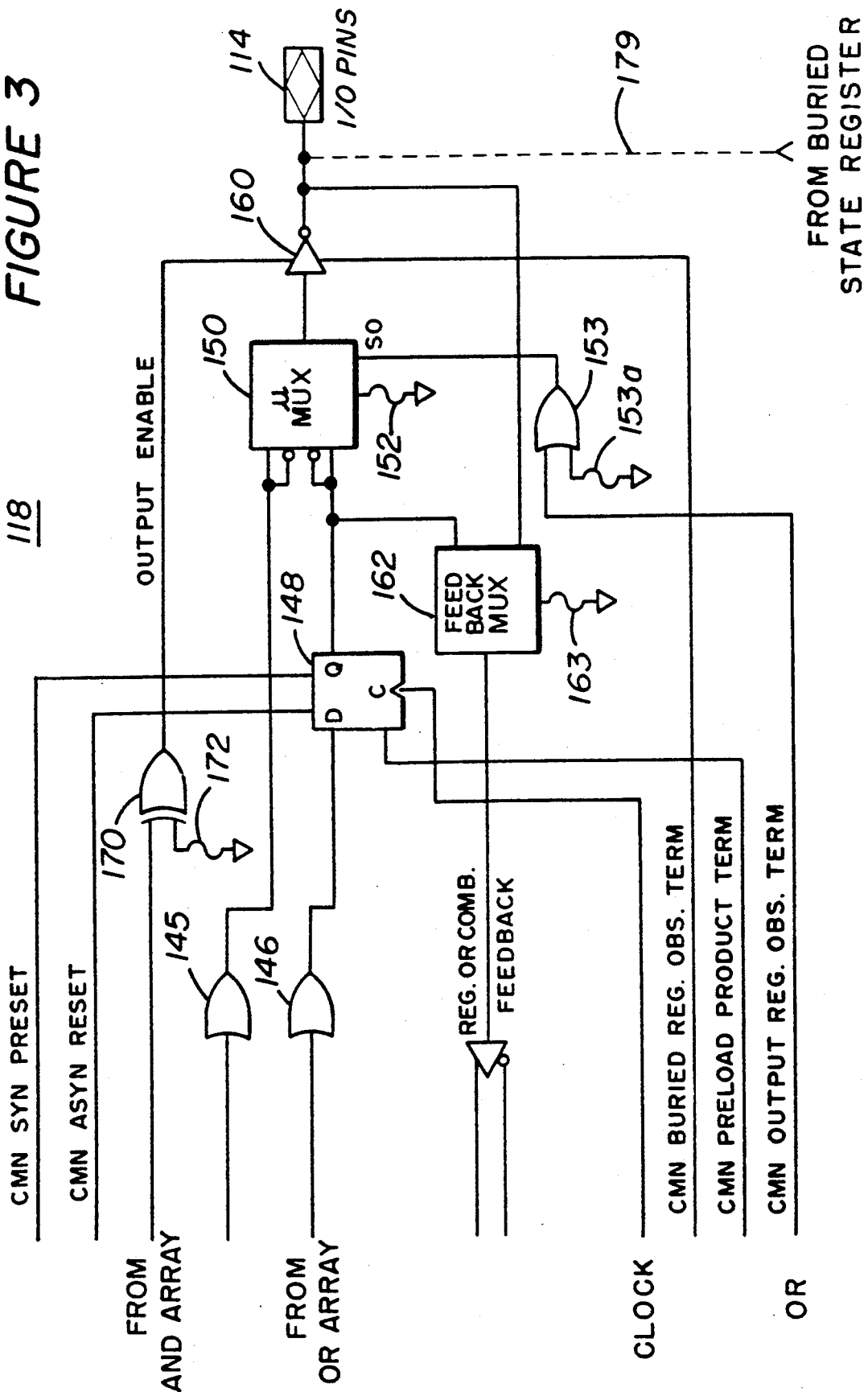
FIG. 3 is a logic diagram of an alternative embodiment of an output macrocell of the present invention.

FIG. 2 illustrates an alternative embodiment in which the buried state registers and output macrocells similar to those shown in FIG. 1 are utilized in a programmable logic array (PLA) device 100. This embodiment employs a programmable AND array 122, similar to that shown in FIG. 1 as element 22, in conjunction with a pair of programmable OR arrays 102a and 102b. Each of the OR arrays receives from AND array 122, on a set of 48 signal lines, 48 "product term" signals and generates therefrom sixteen signals in an AND/OR (PLA) type of architecture. As this embodiment differs from that illustrated in FIG. 1 only in the employment of OR arrays, details of the output macrocells and in the clocking mechanism, many of the elements shown therein are omitted from FIG. 2 in the interest of clarity. The suffixes "a" and "b" are used on FIG. 2 and its description when referring to elements forming a portion of an output macrocell 118a or of an output macrocell 118b, respectively, or of a buried state register portion 120a or a buried state register portion 120b, respectively. Reference numerals used in FIGS. 2 and 3 are preceded by a "1" which indicates a like element in FIG. 1 not preceded by the "1."

A first bank of I/O pins, such as six, of which only one is shown 112a in FIG. 2, serves a first set of six, output macrocells 118a and a second bank of I/O pins, such as six, of which only one 112b is shown, serves a second set of six output macrocells 118b. A first set of four buried state register portions, of which only one 120a is shown, is associated with the OR array 102a and the output macrocells 118a, while a second set of four buried state register portions, of which only one 120b is shown, is associated with the OR array 102b and the output macrocells 118b.

Each buried state register portion 120a and 102b receives a signal from OR array 102a and 102b, respectively, in the same manner shown in FIG. 1 in which register 76 receives at its D input the signal generated by OR gate. Accordingly, each portion 120a and 120b comprises a register receiving the signal generated by an OR gate within OR array 102a or 102b, respectively, and generates therefrom a signal at its Q output which is conducted back to AND array 122 on signal lines 180a and 180b, respectively, via buffers 178a and 178b, respectively. Similarly, the signals generated by the buried state registers 120a and 120b are conducted to the output macrocells 118a and 118b, respectively, via signal lines 179a and 179b, respectively, where they may be observed at the I/O pins 112a and 112b, respectively, upon application of an OBSERVABILITY signal, as described above in connection with FIG. 1.

In all respects, the buried state register portions 120a and 120b illustrated in FIG. 2 are identical in structure and function with the buried state register portion 20 shown in FIG. 1 and, accordingly, will not be described in further detail. However, the output macrocells 118a and 118b differ in some respects from the output macrocell 18 illustrated in FIG. 1.

With reference to FIG. 3, an output macrocell 118, representative of macrocells 118a and 118b of FIG. 2, receives both a first and a second signal from OR array 102a and 102b. The first such signal is conducted to the D input of a register 148, as is the case in the output macrocell 18 illustrated in FIG. 1. The second such signal is conducted to first true and complemented input terminal of an output and polarity select 4-to-1 multiplexer (MUX) 150. The Q output terminal of register 148 is connected to second true and complemented input of output select MUX 150. The output select MUX 150 of output macrocell 118 accordingly receives separate signals from the OR array to allow the user to pass either the first, combinatorial signal directly from the OR array to the I/O pin or the second, registered signal to the I/O pin. In the former case, the register behaves as a buried register. Provision of the separate signals from the OR array via OR gates 145 and 146 allows use of the register 148 of output macrocell 118 as another "buried" register, in the case where the combinatorial output signal on line 145 is selected by output select MUX 150, rather than the contents of register 148, to be conducted to I/O pin 114.

A common output register observability term signal is received at a first input to an output register observability control OR gate 153 which generates a signal which, in turn, is conducted to an SO output control terminal of MUX 150. A field-programmable fusible link 153a is connected to a second input of OR gate 153. Field-programmable fusible link 152 connected to MUX 150 provides a similar polarity control function described earlier in connection with MUX 50 of FIG. 1. A common buried register observability term signal is conducted to inverting output buffer 160.

The status of fuses 153a and 152 determines whether the registered or combinatorial signal will be conducted to I/O pin 114, and whether this signal so conducted will be active HIGH or active LOW, respectively. With fuse 153a intact, the combinatorial signal is generated at pin 114, but the user can observe the contents of output registers 148 at pin 114 by setting the common output register observability term signal HIGH. The user can observe the contents of the buried register 76 served by I/O pin 114 by setting the common buried register observability signal HIGH, thereby disabling output buffer 160, in the manner described earlier in connection with FIG. 1. In all other respects, the output macrocell 118 illustrated in FIG. 3 is identical in structure and function with the output macrocell 18 shown in FIG. 1, and accordingly, will not be described in further detail.

The contents of the buried state register portions 120a and 120b are conducted via lines 179a and 179b, respectively, to the output macrocells 118a and 118b, respectively, as shown in FIG. 2. A signal line 179, representative of lines 179a and 179b is shown in FIG. 3 as conducting the signal generated by the inverting buffer (82 in FIG. 1) serving the buried state register (76 in FIG. 1) to the I/O pin 114, in the same way as described in connection with FIG. 1.

As shown in FIG. 3, a common preload product term signal is received by register 148 from the AND array 122 which allows the user to set the state of register 148 during preliminary circuit verification when Zener voltages may not be available for this purpose. A common preload product term signal is also received by the buried state register portions 120a and 120b for preloading of these registers as well.

A first clock signal (CLK/I) applied to the integrated circuit package containing the PAL 100 is conducted on signal line 190 to a first input terminal of a fuse-programmable two-input, two-output clock multiplexer (CLK MUX) 192. A second clock signal (CLK/II) applied to PAL 100 is conducted to the second input terminal of CLK MUX 192 as well as to the programmable AND array 122. By appropriate programming of the field-programmable fuse 194 connected to a control select input (S0) of CLK MUX 192, the clock signals CLK1 and CLK2 generated at each of its outputs is either the CLK I or CLK II signal. The clock signal generated by MUX 192 at its first output, CLK1, is conducted to the register 148a of the first bank output macrocells 118a and to the register 176a of the buried state register portions 120a and the clock signal generated at its second output, CLK2, is conducted to the register 148b of the second bank output macrocells 118b and to the register 176b of the buried state register portions 120b. Furthermore, provision of fuse-programmable CLK MUX 192 allows the use of a common clock (CLK I) or different clocks CLK I and CLK II for each bank.

Another alternative embodiment to the PLA device shown in FIG. 2 is one in which a common clock is employed to provide the CLK1 and CLK2 signals received by the output macrocells 118a and 118b and the buried state registers 120a and 120b, employed in a single bank. In this single-bank alternative embodiment, the programmable OR array 102a is connected to the output macrocells 118a and 118b, rather than elements 118a and 120a, while the programmable OR array 102b is connected to the buried state register portions 120a and 120b, rather than elements 118b and 120b. These connections provide a separate output generation OR array 1-2a and a separate control sequencing OR array 102b so that the user can programmably specify dynamic control signals for the output macrocells 118a and 120a and independently specify control signals for the buried state register portions 120a and 120b.

The foregoing description of alternative preferred embodiments of the invention has been presented for purposes of illustration and description. They are not intended to be exhaustive or to limit the invention to the precise forms disclosed, and obviously many modifications and variations are possible in light of the above teaching. The programmable array logic device and the programmable logic array device embodiment are chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

Apparatus according to one embodiment of the invention will now be described in additional detail.

Figure 4:
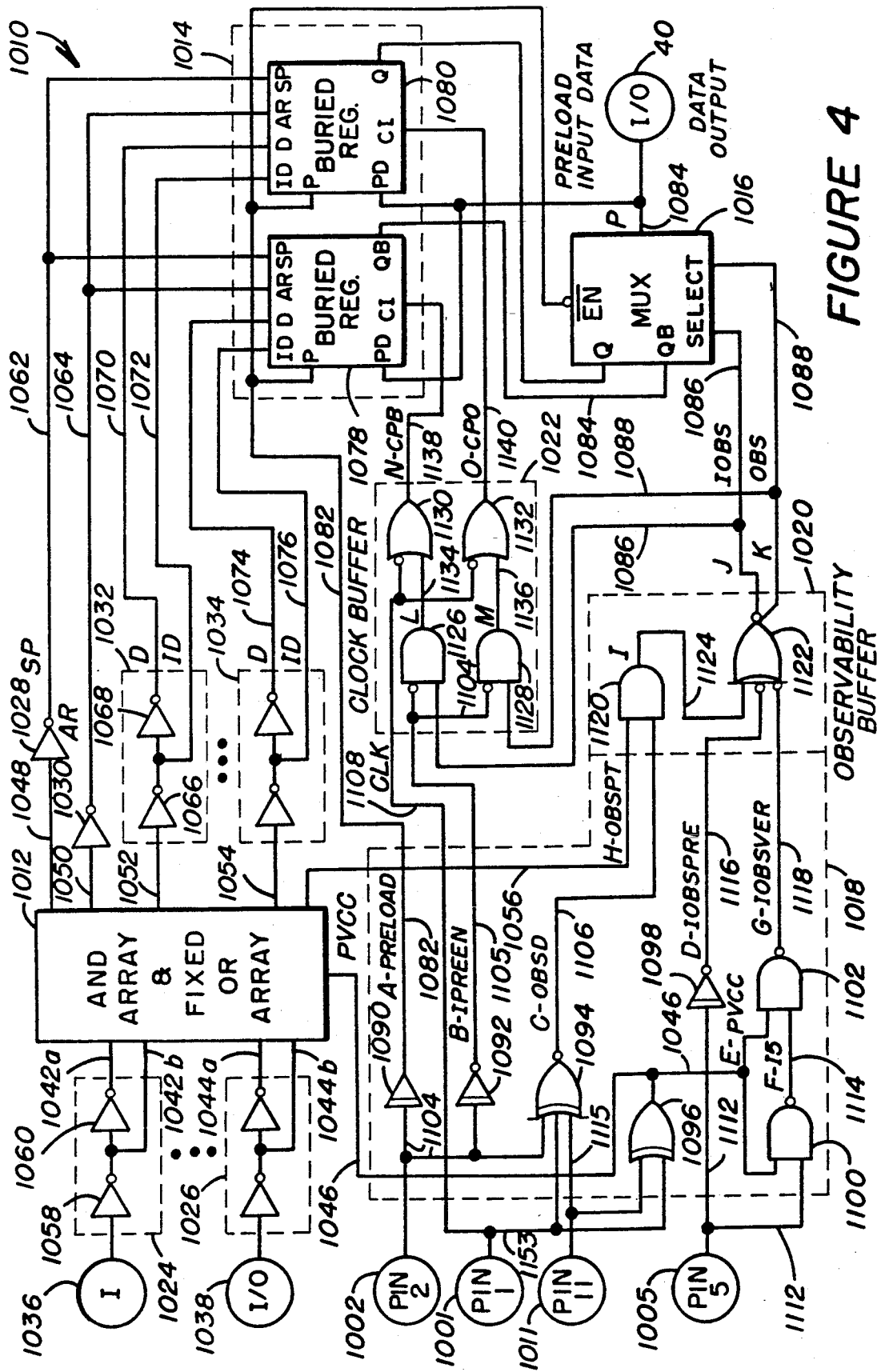
FIG. 4 is a block diagram of a programmable logic device in accordance with the present invention.

Referring to FIG. 4, a programmable array logic (PAL) device 1010 includes a programmable logic array 1012, a register pair 1014, a multiplexer 1016, input logic 1018, an observability buffer 1020, and a dual clock buffer 1022. Associated with logic array 1012 are a number of input buffers such as buffers 1024 and 1026, a number of output buffers such as buffers 1028 and 1030, and a number of data sense amplifiers such as those shown at 1032 and 1034. External inputs and outputs to logic device 1010 include pins 1001, 1002, 1005, and 1011 as well as input pin 1036 and I/O pins 1038 and 1040.

Logic array 1012 is preferably a fuse programmable AND array and a fixed OR array having a plurality of array inputs such as inputs 1042a/b and 1044a/b, a plurality of control inputs such as control input 1046, and a plurality of array outputs such as outputs 1048, 1050, 1052, 1054, and 1056. Alternatively or additionally, logic array 1012 can include a fuse programmable OR array. The manufacture and use of a logic array 1012 is well known to those skilled in the art, and will not be discussed here in detail. A good reference describing PAL architecture is the *Programmable Array Logic Handbook* published by Advanced Micro Devices, Inc. of Sunnyvale, Calif.

Input buffer 1024 couples input pin 1036 to array input lines 1042a and 1042b. More specifically, input pin 1036 is coupled to the input of a first inverter 1058, the output of which is coupled to array input 1042b and to the input of a second inverter 1060 which has an output coupled to array input 1042a. Thus, a signal applied to pin 1036 is developed on input 1042a, and its inverse is developed on input 1042b. In an analogous manner, a signal applied to pin 1038 develops a signal on input 1044a, and an inverse signal on input 1044b.

Array outputs 1048 and 1050 are inverted by inverters 1028 and 1030, respectively, to produce a synchronous preset (SP) signal on a line 1062, and an asynchronous reset (AR) signal on a line 1064. Data sense amplifier 1032 includes a first inverter 1066 and a second inverter 1068 which produce a data (D) signal on a line 1070 and an inverse data signal (ID) on a line 1072. Similarly, data sense amplifier 1034 produces a data signal (D) on a line 1074 and an inverse data signal (ID) on a line 1076.

The register pair 1014 includes a buried register 1078 and an output register 1080. Both buried register 1078 and output register 1080 include a preload enable (P) input, an inverse data input (ID), a data input (D), an asynchronous reset input (AR), a synchronous preset input (SP), a preload data input (PD), and a clock input (CI). Buried register 1078 has a data output QB, and output register 1080 has a data output Q.

Buried register 1078 has its ID and D inputs coupled to lines 1076 and 1074, respectively, and its AR and SP inputs coupled to lines 1064 and 1062, respectively. Output register 1080 has its ID and D inputs coupled to lines 1072 and 1070, respectively, and its AR and SP inputs coupled to lines 1064 and 1062, respectively. The P inputs of buried register 1078 and output register 1080 are both coupled to a line 1082, and their PD inputs are coupled to I/O pin 1040 by a line 1084.

Multiplexer 1016 has a Q input which is coupled to the Q output of output register 1080, and a QB input which is coupled to the QB output of buried registers 1078. Multiplexer 1016 also has an IOBS select input coupled to a line 1086, and an OBS select input coupled to a line 1088. The IOBS and OBS select inputs determine which of data inputs Q and QB is multiplexed to line 1084 and thus to I/O pin 1040.

Input logic 1018 includes a zenered buffer 1090, a zenered inverter 1092, a zenered NOR gate 1094, a zenered OR gate 1096, a zenered inverter 1098, and a pair of NAND gates 1100 and 1102. Zenered gates 1090-1098 are tri-level logic devices having input logic levels LO, HI, and ZHI. In TTL implementations of the present device, a LO input is no more than 0.8 volts, a HI input is no less than 2.0 volts, and a ZHI input is nominally 11 volts. While the outputs of zenered gates 1090-1098 have internal logic levels that are either LO or HI, only ZHI is recognized as a logical high input to the zenered gates. Thus, applying ZHI to the input of zenered buffer 1090 produces an internal logic level HI on line 1082, and applying a LO or HI to the input of zenered buffer 1090 produces an internal logic level LO on line 1082. The rest of the gates of logic device 1010 are not zenered, and thus are responsive to and generate only LO and HI logic signals.

Pin 1002 is coupled to a line 1104 which is connected to inputs of zenered buffer 1090, zenered inverter 1092, and zenered NOR gate 1094. Zenered buffer 1090 develops a preload enable signal (PRELOAD) on line 1082, zenered invertor 1092 develops an inverted preload enable signal (IPREEN) on a line 1105, and zenered NOR gate 1094 develops an observability disable (OBSD) signal on a line 1106.

Pin 1001 is connected to a line 1108 which is coupled to dual clock buffer 1022, zenered NOR gate 1094, and zenered OR gate 1096. Except during the program mode of the present device, pin 1001 is used as an external clock input pin, and develops a CLOCK signal on line 1108. The CLOCK signal on line 1108 can generally be considered to be the master clock for the device 1010.

Pin 1011 is coupled by a line 1110 to an input of zenered NOR gate 1094 and to an input of zenered OR gate 1096. Zenered OR gate 1096 develops a programming and verification (PVCC) signal on line 1046 which is input to logic array 1012 and to NAND gates 1100 and 1102.

Pin 1005 is coupled to a line 1112 which is input into zenered inverter 1098 and to NAND gates 1100. The output of NAND gate 1100 on a line 1114 is input to NAND gate 1102 as the signal I5. Zenered inverter 1098 develops an observe during preload signal (IOBSPRE) on a line 1116, and NAND gate 1102 develops an observe during verify (IOBSVER) signal on a line 1118.

The observability buffer 1020 includes an AND gate 1120 and an OR gate 1122. AND gate 1120 is coupled to line 1056 of logic array 1012 and to line 1106 of input logic 1018. The output of AND gate 1120 is developed on a line 1124 which is a non-inverted input to OR gate 1122. OR gate 1122 has a pair of inverted inputs which are coupled to lines 1116 and 1118 of input logic 1018, and an inverted output on line 1086 and a non-inverted output on a line 1088. The signal on line 1088 is the observation signal (OBS), and the signal on line 1086 is the inverse observation signal (IOBS).

Clock buffer 1022 includes a pair of AND gates 1126 and 1128, and a pair of OR gates 1130 and 1132. Inverted inputs of AND gates 1126 and 1128 are coupled to line 1105, and non-inverted inputs to AND gates 1126 and 1128 are coupled to lines 1086 and 1088, respectively. The outputs of AND gates 1126 and 1128 on lines 1134 and 1136, respectively, are input to OR gates 1130 and 1132, respectively. Inverted inputs to OR gates 1130 and 1132 are coupled to line 1108. OR gate 1130 develops a buried register clock signal (CPB) on a line 1138, and OR gate 1132 develops a output register clock signal (CPO) on a line 1140. Line 1138 is coupled to the clock input of buried register 1078, and line 1140 is coupled to the clock input of output register 1080.

As mentioned previously, logic device 1010 operates on three input logic levels, namely LO, HI, and ZHI. The logic device 1010 has four modes of operation, namely the logic mode, the preload mode, the verify mode, and the program mode. Of these four modes, the first three are associated with observing the contents of register pair 1014, and the program mode is used to program the logic array 1012. The four modes of operation will be discussed one at a time, commencing with the observability modes, and finishing with the programming mode.

LOGIC MODE

Figures 5B, 8:
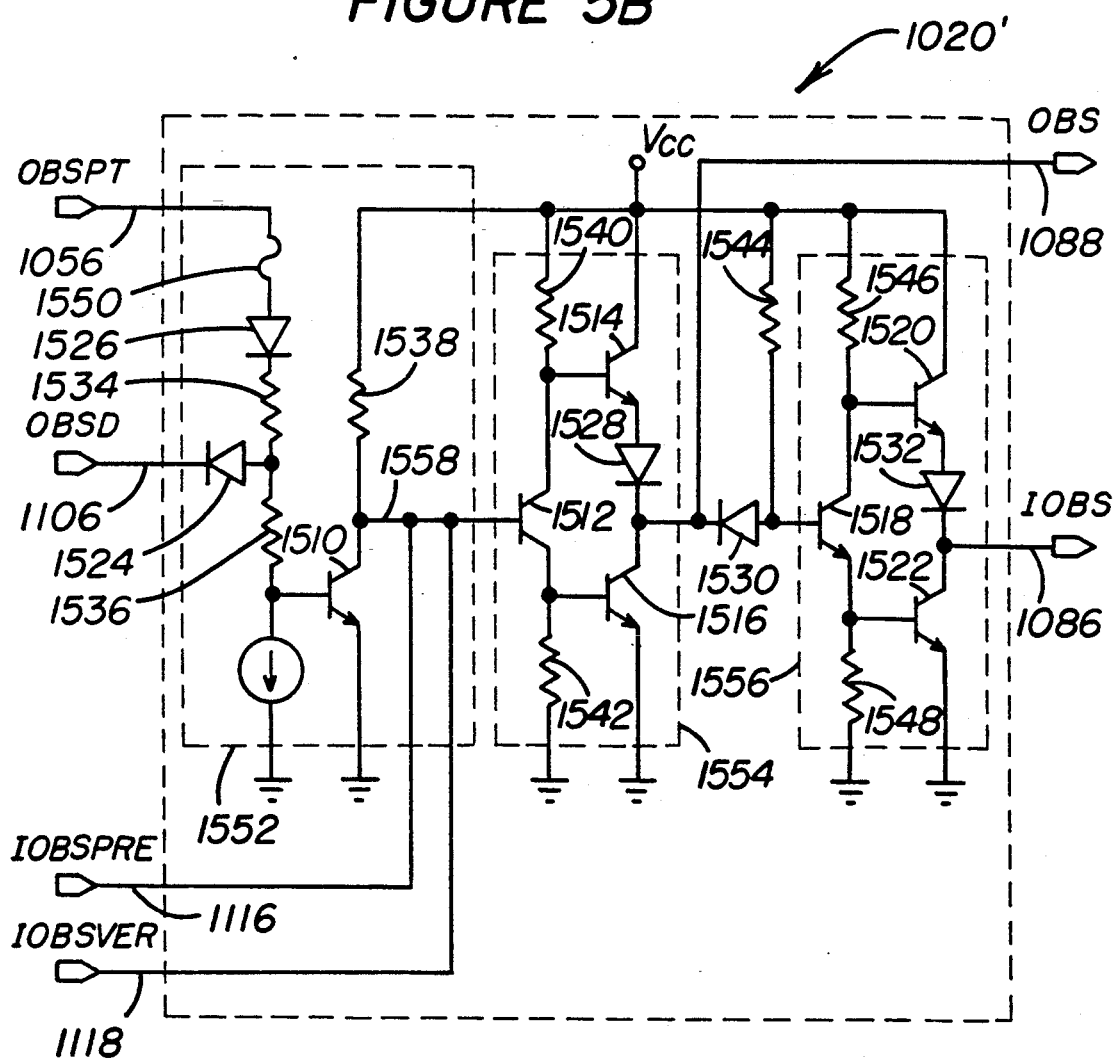

The logic mode of operation of logic device 1010 will be discussed with reference to FIGS. 4, 5a, and 5b. FIG. 5a is a truth table for the various input, output, and internal signals found in logic device 1010, and FIG. 5b is the legend for FIG. 5a. The encircled letters A-P in FIG. 4 correspond to the encircled letters A-P of FIG. 5a.

When in the logic mode, data of either output register 1080 or of buried state register 1078 can be observed under user control by producing an OBSPT signal on line 1056. To observe the data of output register 1080, the OBSPT signal on line 1056 must be LO, and to observe the data of the buried state register 1078 the OBSPT on line 1056 must be HI. The OBSPT is produced within logic array 1012 from the various inputs 1036 and 1038.

When in the logic mode, none of pins 1001, 1002, 1005, or 1011 are zenered. Thus, the PRELOAD signal on line 1082 is LO, the IPREEN signal on line 1105 is HI, the OBSD signal on line 1106 is HI, the IOBSPRE signal D on line 1116 is HI, and the IOBSVER signal on line 1118 is HI. Since the PRELOAD enable inputs of buried register 1078 and output register 1080 are not enabled by the PRELOAD signal, register pair 1014 operate as standard Set/Reset (SR) or D-type registers.

Since the IPREEN signal on line 1105 is HI, the output signals at L and M of AND gates 1126 and 1128, respectively, are LO. Therefore, the CLOCK signal on line 1108 is inverted by OR gates 1130 and 1132 and are output on lines 1138 and 1140, respectively, as clock signals CPB and CPO. It should be noted that when in the logic mode, clock signals CPB and CPO are synchronized, and are essentially an inverted image of the CLOCK signal. Therefore, buried registers 1078 and output register 1080 are clocked together during the logic mode, and the device 1010 operates as if it only had a single clock.

Every clock cycle the buried register 1078 and the output register 1080 clock in data from the outputs of data sense amplifier 1034 and 1032, respectively. The data being clocked into registers 1078 and 1080 will, after a short internal delay, show up at outputs QB and Q, respectively.

Multiplexer 1016 couples either the Q output of output register 1080 or the QB output of buried register 1078 to line 1084 under the control of the IOBS and the OBS signals on lines 1086 and 1088, respectively. Since the OBSD signal on line 1106, the IOBSPRE signal on line 1116, and the IOBSVER signal on line 1118 are all HI, the OBS signal on line 1088 is essentially the same as the OBSPT signal on line 1056. When OBS on line 1088 is HI and IOBS on line 1086 is LO, QB is multiplexed to line 1084, and in the inverse case Q is multiplexed to line 1084. Thus, when in the logic mode, a logical HI signal on line 1056 allows the observation of the contents of buried register 1078, while a logical LO signal on line 1056 allows the observation of output register 1080.

PRELOAD MODE

Still referring to FIGS. 4, 5a, and 5b, to preload the buried register 1078 and output register 1080 the pin 1002 is raised to a ZHI logic level, which causes the PRELOAD signal on line 1082 to go HI, the IPREEN signal on line 1105 to go LO, and the OBSD signal on line 1106 to go LO. The HI on line 1082 enables the preload inputs of buried register 1078 and output register 1080. The HI on line 1082 furthermore disables multiplexer 1016, causing it output on line 1084 to be tri-stated via an inverted enable input EN. The LO logic level IPREEN signal on line 1105 enables AND gates 1126 and 1128, and the LO logic level OBSD signal on line 1106 disables AND gate 1120, causing the signal level on line 1124 to go LO.

If the input signal on pin 1005 is LO or HI, the signal IOBSPRE on line 1116 will be HI, as will be the IOBSVER signal on line 1118. Since the signal level on line 1124 is LO, and the signals on lines 1116 and 1118 are HI, the OBS signal on line 1088 will be LO, and the IOBS signal on line 1086 will be HI.

Furthermore, since line 1086 and 1088 are also inputs to the clock buffer 1022, a HI signal for IOBS and a LO signal for OBS enables AND gate 1126 and disables AND gate 1128. Since the IPREEN signal on line 1105 is LO, the output of AND gate 1126 if HI and the output of AND gate 1128 on line 1136 is LO. Thus, the CPB signal on line 1138 must always be HI, while the signal CPO on line 1140 will be the inverse of the CLOCK signal on line 1108. In consequence, only output register 1080 will be clocked when pin 1002 is at a ZHI level and pin 1005 is at a LO or HI level, and only output register 1080 will be preloaded via a line 1084.

If pin 1005 is raised to ZHI while pin 1002 is still at a ZHI level, IOBSPRE on line 1116 is forced LO which, in turn, forces OBS on line 1088 HI and IOBS on line 1086 LO. As mentioned previously, multiplexer 1016 is disabled and its output on line 1084 is tri-stated during the preload cycle. Furthermore, the OBS and IOBS signals on lines 1088 and 1086, respectively, disable AND gate 1126 and enable AND gate 1128. Thus, when OBS is HI and IOBS is LO, CPO on line 1140 is HI while CPB on line 1138 is essentially an inversion of the clock signal on line 1108. In consequence, only buried register 1078 is clocked and thus only buried register 1078 preloads data from line 1084.

It is important to note that clock buffer 1022 operates differently in the preload mode than it did in the logic mode. As mentioned previously, in the logic mode CPB and CPO were essentially the same clock signals. However, in the preload mode only one of the clock signals CPB and CPO is activated at a time under the control of the input signal applied to pin 1005.

Figure 6:
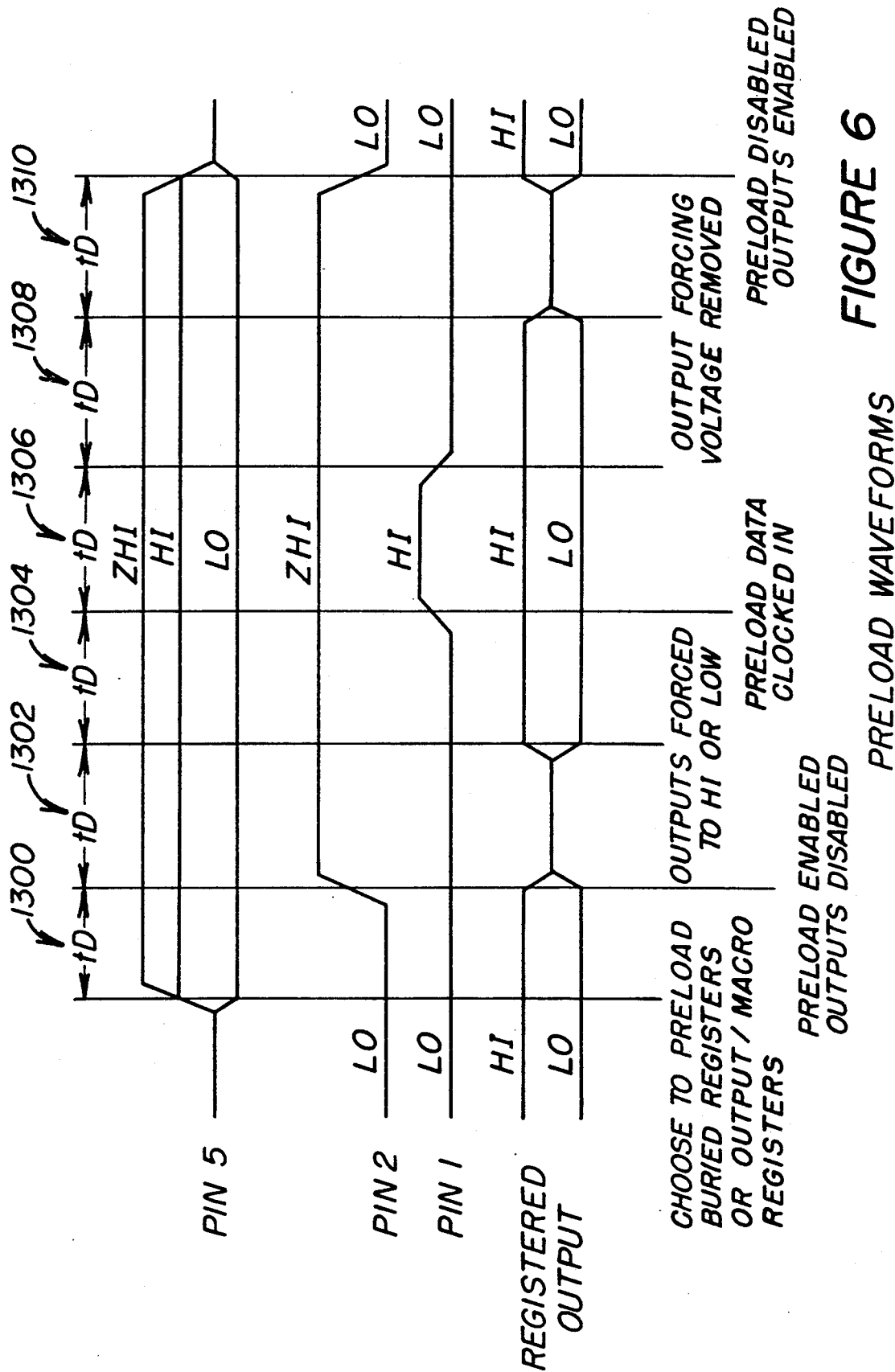
FIG. 6 is a timing diagram of various signals used during the preload mode.

The preload waveforms will be discussed with reference to FIG. 6. Time delays or periods are indicated by tD, and are not necessarily to scale. During a first period 1300, pin 1005 is raised to ZHI if the buried state registers are to be preloaded, and is HI or LO if the output registers are to be loaded. During period 1302, pin 1002 is raised to ZHI to preload enable the buried register 1078 and the output register 1080. After a time delay in period 1304, the preload data is clocked into the selected register during a period 1306. After time delay periods 1308 and 1310 the ZHI logic level on pin 1002 is removed and the preload cycle is completed.

VERIFICATION MODE

The verification mode can be used to verify product terms stored within logic array 1012. Since all of the product terms are associated either with a buried register 1078 or an output register 1080, it is necessary to clock the desired product term into a register and then observe the contents of that register.

To enter the verification mode, pin 1011 is forced to a ZHI level which, in turn, forces OBSD on line 1106 to a LO, and PVCC on line 1046 to a HI. The HI logic level PVCC signal on line 1046 is input to logic array 1012 to enable appropriate gates within the logic array so that individually selected product terms are developed on the array outputs 1052 and 1054. The HI logic level PVCC signal is also input into NAND gates 1100 and 1102. As before, the LO logic level OBSD signal on line 1106 forces AND gate 1120 to output a LO logic level signal on line 1124.

Pin 1005 is used to select either the output QB of buried register 1078 or the output Q of register 1080 for observation. When pin 1005 is LO, signal I5 on line 1114 is HI and signal IOBSVER on line 1118 is LO. This, in turn, forces OBS on line 1088 to go HI and IOBS on line 1086 to go LO. Since IPREEN on line 1105 is HI, CPB on line 1138 and CPO on line 1140 are essentially inversions of the CLOCK signal on line 1108. Thus, individually selected product terms from logic array 1012 are being loaded into buried register 1078 and output register 1080 on a CLOCK pulse. With OBS on line 1088 HI, multiplexer 1016 selects input QB for output on line 1084.

When pin 1005 is HI, signal I5 on line 1114 is forced LO and IOBSVER on line 1118 is forced HI. Since the signal on line 1124 is LO, IOBSPRE on line 1116 is HI, and IOBSVER on line 1118 is HI, the OR gate 1122 forces the OBS signal on line 1088 to a LO level and IOBS on line 1086 to a HI level. Again, individually selected product terms from logic array are clocked into buried register 1078 and output register 1080 on a CLOCK pulse. However, multiplexer 1016 is caused to select input Q for output on line 1084 when pin 1005 is forced HI.

Figure 7:
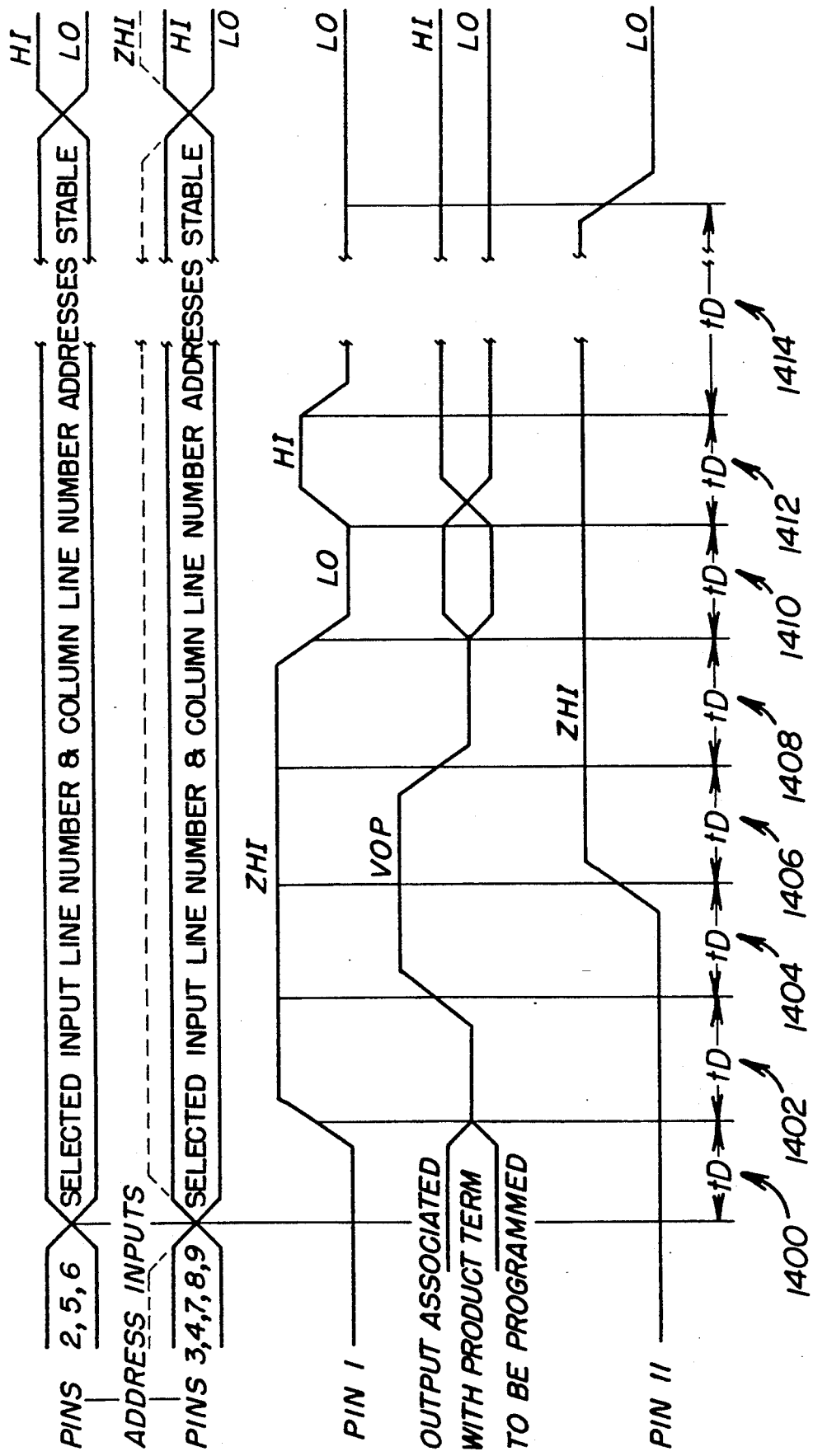
FIG. 7 is a timing diagram of the various signals during the programming mode and verification mode.

Referring now to FIG. 7, the verification waveforms will be discussed. As before, tD represents a time delay or period, and is not necessarily to scale in the drawings. Starting in period 1410, pin 1011 is at the ZHI level to force device 1010 into its verification mode. After a time delay in period 1410, a CLOCK signal is applied to pin 1001 to permit individually selected product terms from logic array 1012 to be clocked into buried register 1078 and output register 1080. The data output at pin 1040 is stable after the end of period 1412.

PROGRAMMING MODE

Referring now to FIGS. 4 and 7, to enter the programming mode the CLOCK signal, if present, is removed from pin 1001 and a ZHI signal is applied to pin 1001. The ZHI level signal on line 1108 forces OBSD on line 1106 to go LO, causing signal on line 1124 to also go LO and the PVCC signal on line 1046 to go HI. Control logic within logic array 1012 is activated by the HI level PVCC signal on line 1046 to permit individually selected product terms within logic array 1012 to be programmed.

Referring more particularly to the waveforms of FIG. 7, after a settling period 1400, pin 1001 is raised to ZHI during period 1402. Column addresses are applied to various input pins, and a programming voltage VOP is applied to the device 1010 during a period 1404. During period 1406, pin 1011 is raised to ZHI to blow the appropriate fuse of the individually selected product term. In the present implementation of device 1010, a blown fuse is a logical Lo as verified on an appropriate output pin.

With reference to FIG. 8, an observability buffer 1020' includes a number of bipolar NPN transistors 1510, 1512, 1514, 1516, 1518, 1520, and 1522; a number of diodes (rectifiers) 1524, 1526, 1528, 1530, and 1532; and a number of resistors 1534, 1536, 1538, 1540, 1542, 1544, 1546, and 1548. A fuse 1550 is provided to balance a fuse within logic array 1012 (not shown).

When in the logic mode, OBSD, IOBSPRE, and IOBSVER are all HI, and the OBSPT signal on line 1056 controls the outputs of observability buffer 1020'. When OBSPT is LO, the base of transistor 1510 will be LO, causing the transistor to turn off. This will force the base of transistor 1512 HI, causing it to conduct and thereby turning off transistor 1514 and turning on transistor 1516. This, in turn, causes the OBS signal on line 1088 to go LO, turns off transistor 1518, turns on transistor 1520, and turns off transistor 1522 to raise the IOBS signal on line 1086 to HI.

When in the logic mode and when OBSPT is HI, transistor 1510 is turned on, forcing the base of transistor 1512 to a LO signal level. This causes transistor 1512 to turn off, transistor 1514 to turn on, and transistor 1516 to turn off, causing the OBS signal on line 1088 to go HI. The base of transistor 1518 is coupled to line 1088 by diode 1530 and will therefore also be at a HI logic level, turning on transistor 1518 and 1522, with the result that the IOBS signal on line 1086 will go LO.

In the preload mode, the OBSD signal on line 1106 is LO, which pulls the base of transistor 1510 down to a LO logic level, shutting it off. In consequence, the OBSPT signal on line 1056 is disabled. Since, in the preload mode, the IOBSVER signal on line 1118 is always HI, the IOBSPRE signal on 1116 will control the outputs of observability buffer 1020'. When the IOBSPRE signal on line 1116 is HI, transistor 1512 is turned on, shutting off transistor 1514 and turning on transistor 1516. The OBS signal on line 1088 will therefore be LO when the IOBSPRE signal 1116 is HI. The IOBS signal on line 1086 will be the inversion of the OBS signal on line 1088 (i.e. HI) because transistors 1518 and 1522 will be off, and transistor 1520 will be on. When the IOBSPRE signal on line 1116 is LO, the base of transistor 1512 is pulled LO, shutting off transistor 1512. This, in turn, turns on transistor 1514 and turns off transistor 1516, causing the OBS signal on line 1088 to go HI and the IOBS signal on line 1086 to go LO.

In the verify mode, the OBSD signal on line 1106 is LO which ensures that transistor 1510 is off and that the OBSPT signal on line 1056 is disabled. Since the IOBSPRE signal on line 1116 is always HI, the IOBSVER signal on line 1118 controls the outputs of the observability buffer 1020'. The IOBSVER signal on line 1118 controls the observability buffer 1020' during the verify mode in the same manner that the IOBSPRE signal on line 1116 controls the observability buffer 1020' during the preload mode.

The observability buffer 1020' can be though of as being comprised of three stages, namely an input stage 1552, a first inversion stage 1554, and a second inversion stage 1556. The input stage 1552 is responsive to a first input signal OBSPT, a second input signal OBSD, a third input signal IOBSPRE, and a fourth input signal IOBSVER, and is operative to develop an intermediate signal on a line 1558. In effect, transistor 1510 and diodes 1524 and 1526 cooperate to perform the logical NAND operation on the OBSPT and OBSD signals, and line 1558 serves as a hard-wired AND for the signal on the collector of transistor 1510 and for the IOBSPRE and IOBSVER signals. The first inversion stage 1554 and the second inversion stage 1556 are substantially identical, and are coupled together by diode 1530.

It should be noted that the logic gates of observability buffer 1020 of FIG. 4 are slightly different than the logic embodied in the three stages of observability buffer 1020' of FIG. 8. This serves as an example that there are many possible logic gate combinations for the observability buffer which can produce the results shown in the truth table of FIG. 5a.

The foregoing description of an embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in many fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

We claim:

1. A programmable logic device for use with power supply and ground voltages applied to said logic device, with an observability signal and with other circuits, comprising:
    a programmable logic circuit having a plurality of logic circuit inputs and a plurality of logic circuit outputs;
    a plurality of data nodes for connection to said other circuits;
    a plurality of buried storage elements, each having a data input and a data output;

means for coupling the data input of a first one of said buried storage elements to receive a first one of said logic circuit outputs; and output coupling means for coupling a given one of said data nodes to receive, selectably in response to said observability signal, (1) a buried storage element signal being the data output of said first one of said buried storage elements if said observability signal is at a first binary value represented by a first voltage between said power supply and ground voltages, or (2) a normal output signal responsive to a second one of said logic circuit outputs if said observability signal is at a second binary value represented by a second voltage between said power supply and ground voltages, said second one of said logic circuit outputs being programmable separately from said first one of said logic circuit outputs.

2. A programmable logic device for use with other circuits, comprising:
a programmable logic circuit having a plurality of logic circuit inputs and a plurality of logic circuit outputs;
a plurality of data nodes for connection to said other circuits;
a plurality of buried storage elements, each having a data input and a data output
means for coupling the data input of a first one of said buried storage elements to receive a first one of said logic circuit outputs; and
output coupling means for coupling a given one of said data nodes to receive, selectably in response to an observability signal, (1) a buried storage element signal being the data output of said first one of said buried storage elements or (2) a normal output signal responsive to a second one of said logic circuit outputs, said second one of said logic circuit outputs being programmable separately from said first one of said logic circuit outputs,
one of said logic circuit outputs being coupled to provide said observability signal.

3. A programmable logic device according to claim 2, wherein each of said buried storage elements is a buried register.

4. A programmable logic device according to claim 2, wherein said programmable logic circuit is a programmable combinatorial logic circuit.

5. A programmable logic device according to claim 4, wherein said output coupling means comprises:
a normal output storage element having a data input and a data output, said data output of said normal output storage element carrying said normal output signal, and
means for coupling said data input of said normal output storage element to receive said second one of said logic circuit outputs.

6. A programmable logic device according to claim 4, wherein said output coupling means comprises:
a normal output storage element having a data input and a data output;
means for coupling said data input of said normal output storage element to receive said second one of said logic circuit outputs; and
programmable means for selecting as said normal output signal either said data output of said normal output storage element or said second one of said logic circuit outputs.

7. A programmable logic device according to claim 4, wherein said output coupling means comprises programmable means for selectively complementing the state of said normal output signal.

8. A programmable logic device according to claim 4, wherein said output coupling means comprises:
a normal output storage element having a data input and a data output;
means for coupling said data input of said normal output storage element to receive said second one of said logic circuit outputs; and
programmable means for selecting as said normal output signal either said data output of said normal output storage element or a third one of said logic circuit outputs,
said first one of said logic circuit outputs, said second one of said logic circuit outputs and said third one of said logic circuit outputs all being programmable separately.

9. A programmable logic device according to claim 4, wherein said output coupling means comprises means for providing said second one of said logic circuit outputs as said normal output signal.

10. A logic device, for use with power supply and ground voltages applied to said device, comprising:
a combinatorial logic circuit having logic circuit inputs and logic circuit outputs and generating on said logic circuit outputs signals which are user-defined logic functions of at least a subset of said logic circuit inputs;
first and second storage elements, each having an output and at least one input, at least one of said inputs of each of said first and second storage elements being coupled to receive a respective one of said logic circuit outputs;
a shared port; and
output select means for coupling to said shared port, in dependence upon a dynamically alterable output select signal, the output of said first storage element if said output select signal is at a first binary value and the output of said second storage element if said output select signal is at a second binary value, said first and second binary values being indicated by voltages which are between said power supply and ground voltages.

11. A logic device according to claim 10, wherein said first and second storage elements are each registers.

12. A logic device according to claim 11, wherein said first register comprises a first D flip-flop having a D input and a Q output, said D input of said first D flip-flop being said at least one input of said first storage element and said Q output of said first D flip-flop being said output of said first storage element, and wherein said second register comprises a second D flip-flop having a D input and a Q output, said D input of said second D flip-flop being said at least one input of said second storage element and said Q output of said second D flip-flop being said output of said second storage element.

13. A logic device according to claim 10, wherein said shared port comprises a package lead.

14. A logic device according to claim 10, wherein said output select signal is carried on a single conductor and wherein said first binary value is a logic zero and said second binary value is a logic one.

15. A logic device comprising:
a combinatorial logic circuit having logic circuit inputs and logic circuit outputs and generating on said logic circuit outputs signals which are user-defined logic functions of at least a subset of said logic circuit inputs;

first and second storage elements, each having an output and at least one input, at least one of said inputs of each of said first and second storage elements being coupled to receive a respective one of said logic circuit outputs;

a shared port; and output select means for coupling to said shared port, in dependence upon an output select signal, the output of said first storage element if said output select signal is at a first binary value and the output of said second storage element if said output select signal is at a second binary value, wherein said output select signal is one of said logic circuit outputs.

16. A logic device according to claim 15, wherein said combinatorial logic circuit comprises:

a first level of logic gates having outputs and having inputs coupled to receive at least a user-defined subset of said logic circuit inputs; and a second level of logic gates having inputs coupled to receive at least a subset of said outputs of said first level and having outputs being at least some of said logic circuit outputs, and wherein said output select signal is one of said outputs of said first level of logic gates.

17. A logic device for use with a preload select signal, comprising:

a combinatorial logic circuit having logic circuit inputs and logic circuit outputs and generating on said logic circuit outputs signals which are user-defined logic functions of at least a subset of said logic circuit inputs;

first and second storage elements, each having an output and at least one input, at least one of said inputs of each of said first and second storage elements being coupled to receive a respective one of said logic circuit outputs;

a shared port; and preloading means for preloading either said first storage element or said second storage element from said shared port, selectably in dependance upon said preload select signal.

18. A logic device according to claim 17, wherein said first and second storage elements are registers.

19. A logic device according to claim 17, for use further with power supply and ground voltages applied to said logic device, wherein said preloading means selects said first storage element for preloading if said preload select signal is between said power supply and ground voltages and selects said second storage element for preloading if said preload select signal is at a predetermined voltage not between said power supply and ground voltages.

20. A logic device according to claim 17, for use further with a clock signal and a preload enable signal having an active and an inactive state, wherein said preloading means comprises means for preloading said first or second storage element from said shared port upon the occurrence of an effective edge transition in said clock signal while said preload enable signal is in said active state.

21. A logic device according to claim 20, wherein one of said logic circuit outputs is coupled to provide said preload enable signal.

22. A logic device according to claim 20, for use further with power supply and ground voltages applied to said logic device, wherein said preload enable signal is in said active state only when it is at a predetermined voltage not between said power supply and ground voltages.

23. A logic device according to claim 17, for use further with a preload enable signal, a clock signal, and power supply and ground voltages applied to said logic device, wherein said preloading means comprises means for preloading said first or second storage element from said shared port upon the occurrence of an effective edge transition in said clock signal while said preload enable signal is at a predetermined voltage not between said power supply and ground voltages, said preloading means selecting said first storage element if said preload select signal is between said power supply and ground voltages and selecting said second storage element if said preload select signal is at a predetermined voltage not between said power supply and ground voltages.

24. A logic device according to claim 23, wherein said first and second storage elements each include a preload enable input, a preload data input, and a clock input, said preload data input of both of said first and second storage elements being coupled to said shared port, and wherein said preloading means comprises:

means for activating said preload enable inputs of both said first and second storage elements when said preload enable signal is at said predetermined voltage; and clock buffer means for, when said preload enable signal is at said predetermined voltage, coupling said clock signal to said clock input of said first storage element only if said preload select signal is between said power supply and ground voltages, and coupling said clock signal to said clock input of said second storage element only if said preload select signal is above said power supply voltage, said clock buffer being further for coupling said clock signal to said clock inputs of both said first and second storage elements when said preload enable signal is between said power supply and ground voltages.

25. A logic device according to claim 23, further comprising first and second package leads, said first package lead being coupled to one of said logic circuit inputs and also being coupled to provide said preload enable signal, and said second package lead being coupled to another one of said logic circuit inputs and also being coupled to provide said preload select signal.

26. A logic device according to claim 17, further comprising output select means for coupling to said shared port the output of either said first or second storage element, selectably in dependence upon an output select signal.

27. A logic device according to claim 26, wherein said output select means couples the output of said first storage element to said shared port if said output select signal is at a first binary value and couples the output of said second storage element to said shared port if said output select signal is at a second binary value.

28. A logic device for use with an observability signal, comprising:

a plurality of package leads;

a combinatorial logic circuit having logic circuit inputs and logic circuit outputs, a first subset of said logic circuit inputs being coupled to a first subset of said package leads, said combinatorial logic circuit being configured such that each of said logic circuit outputs performs a user-defined logic function of at least a subset of said logic circuit inputs;

a plurality of buried storage elements, each having an output, a preload data input, and at least one additional input;

means for coupling at least one of said additional inputs of a first one of said buried storage elements to receive a first one of said logic circuit outputs;

output coupling means for coupling a first one of said package leads to receive a signal selected, in response to said observability signal, from at least (1) a buried storage element signal being the output of said first one of said buried storage elements and (2) a normal output signal responsive to a second one of said logic circuit outputs, said second one of said logic circuit outputs being different from said first one of said logic circuit outputs; and preload means coupled to said preload data input of said first one of said buried storage elements, for preloading said first one of said buried storage elements with data present on said first one of said package leads at a desired time.

29. A logic device according to claim 28, wherein said output coupling means comprises:

a normal output storage element having a logic level input and a data output, said data output of said normal output storage element carrying said normal output signal, and means for coupling said logic level input of said normal output storage element to receive said second one of said logic circuit outputs.

30. A logic device according to claim 29, wherein said normal output storage element and each of said buried storage elements are registers.

31. A logic device according to claim 29, wherein said normal output storage element further has a preload data input, wherein said preload means is further coupled to said preload data input of said normal output storage element, and wherein said preload means is further for preloading said normal output storage element with data present on said first one of said package leads at a different desired time.

32. A logic device according to claim 28, wherein said output coupling means comprises:

a normal output storage element having a logic level input and a data output;

means for coupling said logic level input of said normal output storage element to receive said second one of said logic circuit outputs; and means for selecting as said normal output signal either said data output of said normal output storage element or said second one of said logic circuit outputs.

33. A logic device according to claim 28, wherein said output coupling means comprises means for complementing the state of said normal output signal.

34. A logic device according to claim 28, wherein said output coupling means comprises:

a normal output storage element having a logic level input and a data output;

means for coupling said logic level input of said normal output storage element to receive said second one of said logic circuit outputs; and means for selecting as said normal output signal either said data output of said normal output storage element or a third one of said logic circuit outputs, said first, second and third ones of said logic circuit outputs all being different ones of said logic circuit outputs.

35. A logic device according to claim 28, wherein said output coupling means comprises means for providing said second one of said logic circuit outputs as said normal output signal.

36. A logic device according to claim 28, wherein one of said logic circuit outputs is coupled to provide said observability signal.

37. A logic device comprising:

a combinatorial logic circuit including logic circuit inputs, a first level of logic gates having outputs and having inputs coupled to receive at least a programmably selectable first subset of said logic circuit inputs, and a second level of logic gates having outputs and having inputs coupled to receive at least a second subset of said outputs of said first level of logic gates;

a first storage element having an output and at least one input, at least one of said inputs of said first storage element being coupled to receive one of said outputs of said second level of logic gates;

a package lead; and verification means for loading a logic level from one of said outputs of said second subset of outputs of said first level of logic gates into said first storage element and coupling said output of said first storage element to said package lead.

38. A logic device according to claim 37, wherein said first storage element is a register.

39. A logic device according to claim 37, wherein said first level of logic gates are AND gates and said second level of logic gates are OR gates.

40. A logic device according to claim 37, wherein said second subset of outputs of said first level of logic gates is programmably selectable.

41. A logic device according to claim 37, further comprising a second storage element having an output and at least one input, at least one of said inputs of said second storage element being coupled to receive one of said outputs of said second level of logic gates, and wherein said verification means is further for loading a logic level from another of said outputs of said second subset of outputs of said first level of logic gates into said second storage element, and for coupling the output of selectably said first storage element or said second storage element to said package lead.

42. A logic device according to claim 37, for use with a verify signal and a clock signal, wherein said verification means comprises means for loading said logic level into said first storage element upon the occurrence of an effective edge transition in said clock signal while said verify signal is in an active state.

43. A logic device according to claim 42, for use with power supply and ground voltages, further comprising an additional package lead, wherein said verify signal is in said active state only when it is at a predetermined voltage above said power supply voltage, said additional package lead being coupled to one of said logic circuit inputs and also being coupled to provide said verify signal.

44. A logic device comprising:

a combinatorial logic circuit having logic circuit inputs and logic circuit outputs and generating on said logic circuit outputs signals which are user-defined logic functions of at least a subset of said logic circuit inputs;

an output storage element and a buried storage element, each having an output and at least one input, at least one of said inputs of each of said output storage element and buried storage element being coupled to receive a respective one of said logic circuit outputs, said output of said buried storage element being coupled to provide one of said logic circuit inputs;

a shared port;

output select means for selectably coupling the output of either the output storage element or the buried storage element to said shared port;

means for operating said logic device in a logic mode, wherein said output select means performs its selection at least partly in dependence upon a particular one of said logic circuit outputs; and means for operating said logic device in a preload mode, including means for preloading selectably said output storage element or said buried storage element from said shared port.

45. A logic device according to claim 44, wherein said logic circuit comprises:

a first level of logic gates having outputs and having inputs coupled to receive at least a user-defined subset of said logic circuit inputs; and a second level of logic gates having outputs and having inputs coupled to receive at least a subset of said outputs of said first level of logic gates, said particular one of said logic circuit outputs being one of said outputs of said first level of logic gates.

46. A logic device according to claim 44, for use with a clock signal and power supply and ground voltages applied to said logic device, further comprising first and second package leads, said first package lead being coupled to one of said logic circuit inputs and also being coupled to provide a preload enable signal, said second package lead being coupled to another of said logic circuit inputs and also being coupled to provide a preload select signal, wherein said means for operating said logic device in a preload mode comprises means for preloading a selected one of said output storage element and buried storage element from said shared port upon the occurrence of an effective edge transition in said clock signal while said preload enable signal is at a predetermined voltage above said power supply voltage, said selected one of said storage elements being selected as said output storage element if said preload select signal is between said power supply and ground voltages, and selected as said buried storage element if said preload select signal is at a voltage above said power supply voltage.

47. A logic device according to claim 44, wherein said logic circuit comprises:

a first level of logic gates having outputs and having inputs coupled to receive at least a user-defined subset of said logic circuit inputs; and a second level of logic gates having outputs and having inputs coupled to receive at least a subset of said outputs of said first level of logic gates, said logic device further comprising means for operating said logic device in a verify mode, including first means for loading a logic level from one of said outputs of said first level of logic gates into said output storage element.

48. A logic device according to claim 47, for use with a clock signal and power supply and ground voltages applied to said logic device, further comprising a third package lead coupled to one of said logic circuit inputs and also coupled to provide a verify signal, said means for operating said logic device in a verify mode further including second means for loading a logic level from one of said outputs of said first level of logic gates into said buried storage element, said first and second means for loading each loading their respective storage elements upon the occurrence of an effective edge transition in said clock signal while said verify signal is at a voltage above said power supply voltage.

49. A logic device comprising:

a programmable combinatorial logic circuit having logic circuit inputs and logic circuit outputs and generating on said logic circuit outputs signals which are user-definable logic functions of at least a subset of said logic circuit inputs;

a first plurality of buried storage elements each having an output and at least one input, at least one of the inputs of each of said buried storage elements being coupled to receive a respective first one of said logic circuit outputs, the output of each of said first plurality of buried storage elements being coupled to provide a respective one of said logic circuit inputs;

a first plurality of package leads;

output coupling means for coupling to each of said first plurality of package leads a signal selected from at least (1) a first buried storage element signal being the output of a respective one of said buried storage elements in said first plurality and (2) a first normal output signal which is user-selectably a storage elemented or combinatorial version of a respective second one of said logic circuit outputs, said second ones of said logic circuit outputs being different from said first one of said logic circuit outputs;

means for operating said logic device in a logic mode, wherein said output coupling means performs its selections at least partly in dependence upon a particular one of said logic circuit outputs; and means for operating said logic device in a preload mode, including means for preloading each of said buried storage elements in said first plurality from a corresponding one of said first plurality of package leads at a desired time.

50. A logic device according to claim 49, further comprising:

a second plurality of buried storage elements each having an output and at least one input, at least one of the inputs of each of said second plurality of buried storage elements being coupled to receive a respective third one of said logic circuit outputs, the output of each of said second plurality of buried storage elements being coupled to provide a respective one of said logic circuit inputs; a plurality of output storage elements each having an output and at least one input, at least one of the inputs of each of said output storage elements being coupled to receive a respective fourth one of said logic circuit outputs; and a second plurality of package leads, said output coupling means being further for coupling to each of said second plurality of package leads a signal selected from at least (1) the output of a respective one of said buried storage elements in said second plurality and (2) the output of a respective one of said plurality of output storage elements.

51. A logic device according to claim 50, for use with a clock signal and power supply and ground voltages applied to said logic device, further comprising first and second package leads, said first package lead being coupled to one of said logic circuit inputs and also being coupled to provide a preload enable signal, said second package lead being coupled to another of said logic circuit inputs and also being coupled to provide a preload select signal, wherein said means for operating said logic device in a preload mode comprises means for preloading each of said output storage elements from a respective one of said second plurality of package leads upon the occurrence of an effective edge transition in said clock signal while said preload enable signal is at a voltage above said power supply voltage and said preload select signal is between said power supply and ground voltages, and for preloading each of said first and second pluralities of buried storage elements from a respective one of said first and second pluralities of package leads upon the occurrence of an effective edge transition in said clock signal while said preload enable signal is at a voltage above said power supply voltage and said preload select signal is at a voltage above said power supply voltage.

52. A logic device according to claim 51, wherein said logic circuit comprises:

a first level of logic gates having outputs and having inputs coupled to receive at least a userdefinable subset of said logic circuit inputs; and a second level of logic gates having outputs and having inputs coupled to receive at least a subset of said outputs of said first level of logic gates, said logic device further comprising:

a third package lead coupled to one of said logic circuit inputs and also coupled to provide a verify signal; and means for operating said logic device in a verify mode including means for loading a logic level from outputs of said first level of logic gates into respective ones of said output storage elements and buried storage elements upon the occurrence of an effective edge transition in said clock signal while said verify signal is at a voltage above said power supply voltage.

53. A programmable logic device for use with other circuitry, comprising:

a programmable combinatorial logic circuit having a plurality of logic circuit inputs and a plurality of logic circuit outputs;

a data node for connection to said other circuitry;

output means having an output enable input terminal, for developing an output signal in response to said logic circuit outputs and for coupling said output signal to said data node in response to an output enable signal on said output enable input terminal; and programmable means for selecting which logic state of said output enable signal will be active to cause output means to couple said output signal to said data node.

54. A programmable logic device according to claim 53, further comprising means for providing one of said logic circuit outputs to said output enable input terminal as said output enable signal.

55. A programmable logic device according to claim 53, wherein said output means comprises a 3-state buffer having an output coupled to said data node and having an enable input, and wherein said programmable means comprises:

an XOR gate having an output coupled to said enable input of said buffer, and further having first and second inputs, said first input of said XOR gate being said output enable input terminal of said output means; and programmable means for applying a desired logic level to said second input of said XOR gate.

56. A programmable logic device according to claim 55, further comprising means for coupling one of said logic circuit outputs to said output enable input terminal of said output means.

57. A programmable logic device for use with other circuitry, comprising:

a programmable combinatorial logic circuit having a plurality of logic circuit inputs and a plurality of logic circuit outputs;

a data node for connection to said other circuits;

normal output coupling means including:

an output storage element having a data input and a data output, said data input of said output storage element being coupled to receive a first one of said logic circuit outputs;

an output multiplexer having an output and first and second inputs, said first input of said output multiplexer being coupled to receive said first one of said logic circuit outputs and said second input of said output multiplexer being coupled to receive said data output of said output storage element;

3-state output circuitry means having an output enable input terminal, for developing a data output signal in response to the output of said multiplexer and for coupling said data output signal to said data node in response to an output enable signal on said output enable input terminal, said output enable input terminal being coupled to receive a third one of said logic circuit outputs as said output enable signal, said 3-state output circuitry means further including means for selecting which logic state of said output enable signal will be active to cause said 3-state output circuitry means to couple said data output signal to said data node; and a programmable feedback multiplexer having an output coupled to one of said logic circuit inputs, a first input coupled to said output of said output storage element and a second input coupled to said data node, said programmable logic device further comprising:

a plurality of buried storage elements, each having a data input coupled to receive a respective one of said logic circuit outputs and further having a data output; and observability coupling means for coupling to said data node the data output of one of said buried storage elements instead of said data output signal in response to a fourth one of said logic circuit outputs, said first logic circuit output, said third logic circuit output, said fourth logic circuit output and each of the logic circuit outputs coupled to data inputs of said buried storage elements, all being programmable separately.

58. A programmable logic device according to claim 57, wherein said output storage element and each of said buried storage elements are all registers.

59. A programmable logic device according to claim 57, wherein said 3-state output circuitry means comprises a 3-state buffer having an output coupled to said data node and having an enable input;

an XOR gate having an output coupled to said enable input of said buffer, and further having first and second inputs, said first input of said XOR gate being said output enable input terminal of said 3-state output circuitry; and programmable means for applying a desired logic level to said second input of said XOR gate to select which logic state of said output enable signal will be active to enable said buffer.

60. A programmable logic device for use with other circuits, comprising:

a programmable combinatorial logic circuit having a plurality of logic circuit inputs and a plurality of logic circuit outputs;

a data node for connection to said other circuits;

an output storage element having a data input and a data output;

means for coupling said data input of said output storage element to a first one of said logic circuit outputs; and programmable output means for providing to said data node a chosen signal being selectably either a second one of said logic circuit outputs or said data output of said output storage element, said second one of said logic circuit outputs being programmable separately from said first one of said logic circuit outputs.

61. A programmable logic device according to claim 60, wherein said programmable output means further comprises programmable means for selectively complementing said chosen signal.

62. A programmable logic device according to claim 60, wherein said output storage element is a register.

63. A programmable logic device according to claim 60, for use further with an observability signal, further comprising:

a buried storage element having a data input and a data output; and means for coupling the data input of said buried storage element to receive a third one of said logic circuit outputs, said third one of said logic circuit outputs being programmable separately from said first and second ones of said logic circuit outputs, wherein said programmable output means is further for providing to said data node, selectably in response to said observability signal, either said chosen signal or said data output of said buried storage element.

64. A programmable logic device according to claim 63, wherein a fourth one of said logic circuit outputs is coupled to provide said observability signal.

65. A programmable logic device for use with other circuits, comprising:

a programmable combinatorial logic circuit having a plurality of logic circuit inputs and a plurality of logic circuit outputs;

a data node for connection to said other circuits;

an output storage element having a data input and a data output;

means for coupling said data input of said output storage element to a first one of said logic circuit outputs;

programmable output means for providing to said data node a chosen signal being selectably either a second one of said logic circuit outputs or said data output of said output storage element, said second one of said logic circuit outputs being programmable separately from said first one of said logic circuit outputs; and programmable feedback means for providing to one of said logic circuit inputs a signal responsive to the signal on selectably either said data node or said data output of said output storage element, the selection made by said programmable feedback means being independent of the selection made by said programmable output means.

66. A method of testing a logic device, said logic device including a plurality of package leads, a buried storage element, an output storage element, and a combinatorial logic circuit having logic circuit inputs and logic circuit outputs, said method comprising the steps of:

providing data from said buried storage element to one of said logic circuit inputs;

preloading data from a shared one of said package leads into said buried storage element on a buried storage element preload cycle;

clocking into said buried storage element, on a clock cycle subsequent to said buried storage element preload cycle, data determined at least in part by one of said logic circuit outputs;

clocking into said output storage element data determined at least in part by an output storage element input coupled to one of said logic circuit outputs;

observing the contents of said output storage element through said shared one of said package leads during a time subsequent to said clock cycle; and observing the contents of said buried storage element through said shared one of said package leads during another time subsequent to said clock cycle.

67. The method of testing a logic device according to claim 66, wherein a first subset of said logic circuit inputs is coupled to a first subset of said package leads, further comprising the step of configuring said combinatorial logic circuit such that each of said logic circuit outputs performs a user-defined logic function of a subset of said logic circuit inputs.

68. A method according to claim 66, further comprising the step of:

preloading data from said shared one of said package leads into said output storage element on an output storage element preload cycle prior to said clock cycle.

69. A method of testing a logic device, said logic device including a plurality of package leads, a combinatorial logic circuit having logic circuit inputs and logic circuit outputs, a buried storage element and an output storage element, said method comprising the steps of:

providing data from said buried storage element to one of said logic circuit inputs;

preloading data from a shared one of said package leads into said buried storage element on a buried storage element preload cycle;

clocking into said buried storage element, on a clock cycle subsequent to said buried storage element preload cycle, data determined at least in part by a first one of said logic circuit outputs;

clocking into said output storage element data determined at least in part by a second one of said logic circuit outputs different from said first one of said logic circuit outputs;

observing the contents of said buried storage element through said shared one of said package leads during a time subsequent to said clock cycle; and providing a normal output signal responsive to said second one of said logic circuit outputs to said shared one of said package leads, during another time subsequent to said clock cycle.

70. The method of testing a logic device according to claim 69, wherein a first subset of said logic circuit inputs is coupled to a first subset of said package leads, further comprising the steps of configuring said combinatorial logic circuit such that each of said logic circuit outputs performs a user-defined logic function of a subset of said logic circuit inputs.

71. A method according to claim 69, wherein said normal output signal is derived at least in part from said output storage element.

72. A method according to claim 69, further comprising the step of:

preloading data from said shared one of said package leads into said output storage element on an output storage element preload cycle prior to said clock cycle.

* * * * *